US006531341B1

(12) United States Patent
Peterson et al.

(10) Patent No.: US 6,531,341 B1
(45) Date of Patent: Mar. 11, 2003

(54) METHOD OF FABRICATING A MICROELECTRONIC DEVICE PACKAGE WITH AN INTEGRAL WINDOW

(75) Inventors: Kenneth A. Peterson, Albuquerque, NM (US); Robert D. Watson, Tijeras, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 09/573,424

(22) Filed: May 16, 2000

(51) Int. Cl.[7] .......................... H01L 21/44; H01L 23/02
(52) U.S. Cl. ...................... 438/123; 438/121; 438/125; 257/680
(58) Field of Search ........................ 438/106–117, 118, 438/119, 124, 125, 126, 123, 122; 257/678, 680, 681, 704, 703; 174/52.4

(56) References Cited

U.S. PATENT DOCUMENTS

| | | | | |
|---|---|---|---|---|
| 3,924,246 A | * | 12/1975 | Scherer ...................... 257/681 |
| 4,622,433 A | * | 11/1986 | Frampton ................... 174/52.4 |
| 4,742,182 A | | 5/1988 | Fuchs ...................... 174/52 FP |
| 4,760,440 A | | 7/1988 | Bigler et al. .................. 357/74 |
| 4,899,118 A | | 2/1990 | Polinski, Sr. ................ 333/246 |
| 5,087,964 A | | 2/1992 | Hatta ............................ 357/74 |
| 5,107,328 A | | 4/1992 | Kinsman ...................... 357/74 |
| 5,150,180 A | * | 9/1992 | Yama ...................... 250/370.01 |
| 5,321,204 A | | 6/1994 | Ko ............................ 174/52.4 |
| 5,352,852 A | | 10/1994 | Chun ........................ 174/52.4 |
| 5,357,056 A | * | 10/1994 | Nagano ..................... 174/52.4 |
| 5,384,689 A | | 1/1995 | Shen ........................... 361/761 |
| 5,506,446 A | * | 4/1996 | Hoffman et al. ............. 257/668 |
| 5,773,323 A | | 6/1998 | Hur ............................. 438/123 |
| 5,773,879 A | * | 6/1998 | Fusayasu et al. ............ 257/678 |
| 5,863,810 A | | 1/1999 | Kaldenberg .................. 438/27 |
| 5,949,655 A | | 9/1999 | Glenn ......................... 361/783 |
| 6,020,629 A | | 2/2000 | Farnworth et al. .......... 257/868 |
| 6,025,213 A | | 2/2000 | Nemoto et al. ............. 438/122 |
| 6,025,767 A | | 2/2000 | Kellam et al. .............. 335/128 |

* cited by examiner

*Primary Examiner*—Wael Fahmy
*Assistant Examiner*—Brook Kebede
(74) *Attorney, Agent, or Firm*—Robert D. Watson

(57) ABSTRACT

A method of fabricating a microelectronic device package with an integral window for providing optical access through an aperture in the package. The package is made of a multilayered insulating material, e.g., a low-temperature cofired ceramic (LTCC) or high-temperature cofired ceramic (HTCC). The window is inserted in-between personalized layers of ceramic green tape during stackup and registration. Then, during baking and firing, the integral window is simultaneously bonded to the sintered ceramic layers of the densified package. Next, the microelectronic device is flip-chip bonded to cofired thick-film metallized traces on the package, where the light-sensitive side is optically accessible through the window. Finally, a cover lid is attached to the opposite side of the package. The result is a compact, low-profile package, flip-chip bonded, hermetically-sealed package having an integral window.

64 Claims, 20 Drawing Sheets

SECTION 1-1

METHOD OF FABRICATING A MICROELECTRONIC DEVICE PACKAGE WITH AN INTEGRAL WINDOW

CROSS-REFERENCE TO RELATED APPLICATIONS

This application is related to a co-pending application, "Microelectronic Device Package with an Integral Window," by Kenneth A. Peterson and Robert D. Watson.

This application is related to U.S. Pat. No. 6,384,473 to Peterson et al., "Microelectronic Device Package with an Integral Window". This application is related to U.S. patent application Ser. No. 10/061,419 to Peterson et al., "Multi-layered Microelectronic Device Package with an Integral Window". This application is related to U.S. patent application Ser. No. 10/062,220 to Peterson et al., "Bi-Level Multilayered Microelectronic Device Package with an Integral Window". This application is related to U.S. patent application Ser. No. 10/061,422 to Peterson et al., "Sealed Symmetric Multilayered Microelectronic Device Package with Integral Windows". This application is related to U.S. patent application Ser. No. 10/083,454 to Peterson et al., "Single Level Microelectronic Device Package with an Integral Window". This application is related to U.S. patent application Ser. No. 10/082,961 to Peterson et al., "Bi-Level Level Microelectronic Device Package with an Integral Window".

FEDERALLY SPONSORED RESEARCH

The United States Government has rights in this invention pursuant to Department of Energy Contract No. DE-AC04-94AL85000 with Sandia Corporation.

BACKGROUND OF THE INVENTION

The present invention relates generally to the field of microelectronics, and more specifically to methods for fabricating a package having an integral window, for packaging at least one microelectronic device.

Many different types of microelectronic devices require a window to provide optical access and protection from the environment. Examples of optically-interactive semiconductor devices include charge-coupled devices (CCD), photo-sensitive cells (photocells), solid-state imaging devices, and UV-light sensitive Erasable Programmable Read-Only Memory (EPROM) chips. All of these devices use microelectronic devices that are sensitive to light over a range of wavelengths, including ultraviolet, infrared, and visible. Other types of semiconductor photonic devices emit light, such as laser diodes and Vertical Cavity Surface-Emitting Laser (VCSELS), which also need to pass light through a protective window.

Microelectromechanical systems (MEMS) and Integrated MEMS (IMEMS) devices (e.g. MEMS devices combined with Integrated Circuit (IC) devices) can also require a window for optical access. Examples of MEMS devices include airbag accelerometers, microengines, microlocks, optical switches, tiltable mirrors, miniature gyroscopes, sensors, and actuators. All of these MEMS devices use active mechanical and/or optical elements. Some examples of active MEMS structures include gears, hinges, levers, slides, tilting mirrors, and optical sensors. These active structures must be free to move or rotate. Optical access through a window is required for MEMS devices that have mirrors and optical elements. Optical access to non-optically active MEMS devices can also be required for inspection, observation, and performance characterization of the moving elements.

Additionally, radiation detectors which detect alpha, beta, and gamma radiation, use "windows" of varying thickness and materials to either transmit, block, or filter these energetic particles. These devices also have a need for windows that transmit or filter radiation to and from the device, while at the same time providing physical and environmental protection.

The word "transparent" is broadly defined herein to include transmission of radiation (e.g. photons and energetic particles) covering a wide range of wavelengths and energies, not just UV, IR, and visible light. Likewise, the word "window" is broadly defined herein to include materials other than optically transparent glass, ceramic, or plastic, such as thin sheets of metal, which can transmit energetic particles (e.g. alpha, beta, gamma, and light or heavy ions).

There is a continuing need in the semiconductor fabrication industry to reduce costs and improve reliability by reducing the number of fabrication steps, while increasing the density of components. One approach is to shrink the size of packaging. Another is to combine as many steps into one by integrating operations. A good example is the use of cofired multilayer ceramic packages. Unfortunately, adding windows to these packages typically increases the complexity and costs.

Hermetically sealed packages are used to satisfy more demanding environmental requirements, such as for military and space applications. The schematic shown in FIG. 1 illustrates a conventional ceramic package for a MEMS device, a CCD chip, or other optically active microelectronic device. The device or chip is die-attached face-up to a ceramic package and then wirebonded to interconnect inside of the package. Metallized circuit traces carry the electrical signal through the ceramic package to electrical leads mounted outside. A glass window is attached as the last step with a frit glass or solder seal. Examples of conventional ceramic packages include Ceramic Dual In-Line Package (CERDIP), EPROM and Ceramic Flatpack designs.

Although stronger, ceramic packages are typically heavier, bulkier, and more expensive to fabricate than plastic molded packages. Problems with using wirebonding include the fragility of very thin wires; wire sweep detachment and breakage during transfer molding; additional space required to accommodate the arched wire shape and toolpath motion of the wirebond toolhead; and the constraint that the window (or cover lid) be attached after the wirebonding step. Also, attachment of the window as the last step can limit the temperature of bonding the window to the package.

FIG. 2 illustrates schematically a conventional molded plastic (e.g. encapsulated) microelectronic package. The chip or device is attached to a lead frame, and a polymer dam prevents the plastic encapsulant from flowing onto the light-sensitive area of the chip or device during plastic transfer molding. The window is generally attached with a polymer adhesive. Problems with this approach include the use of fragile wirebonded interconnections; and plastic encapsulation, which does not provide hermetic sealing against moisture intrusion.

Flip-chip mounting of microelectronic devices is a commonly used alternative to wirebonding. In flip-chip mounting the chip or device is mounted face-down and then reflow soldered using small solder balls or "bumps" to a substrate having a matching pattern of circuit traces (such as a printed wiring board). All of the solder joints are made simultaneously. Excess spreading of the molten solder ball is prevented by the use of specially-designed bonding pads.

Flip-chip mounting has been successfully used in fabricating Multi-Chip Modules (MCM's), Chip-on-Board, Silicon-on-Silicon, and Ball Grid Array packaging designs.

Flip-chip mounting has many benefits over traditional wirebonding, including increased packaging density, lower lead inductance, shorter circuit traces, thinner package height, no thin wires to break, and simultaneous mechanical die-attach and electrical circuit interconnection. Another advantage is that the chips are naturally self-aligning due to surface tension when using molten solder balls. It is also possible to replace the metallic solder bumps with bumps, or dollops, of an electrically-conductive polymer or epoxy (e.g. silver-filled epoxy). Flip-chip mounting avoids potential problems associated with ultrasonic bonding techniques that can impart stressful vibrations to a fragile (e.g. released) MEMS structure.

Despite the well-known advantages of flip-chip mounting, this technique has not been widely practiced for packaging of MEMS devices, Integrated MEMS (IMEMS), or CCD chips because attaching the chip face-down to a solid, opaque substrate prevents optical access to the optically-active, light-sensitive surface.

The cost of fabricating ceramic packages can be reduced by using cofired ceramic multilayer packages. Multilayer packages are presently used in many product categories, including leadless chip carriers, pin-grid arrays (PGA's), side-brazed dual-in-line packages (DIP's), flatpacks, and leaded chip carriers. Depending on the application, 5–40 layers of dielectric layers can be used, each having printed signal traces, ground planes, and power planes. Each signal layer can be connected to adjacent layers above and below by conductive vias passing through the dielectric layers.

Electrically conducting metallized traces, thick-film resistors, and solder-filled vias or Z-interconnects are conventionally made by thick-film metallization techniques, including screen-printing. Multiple layers are printed, vias-created, stacked, collated, and registered. The layers are then joined together (e.g. laminated) by a process of burnout, followed by firing at elevated temperatures. Burnout at 350–600 C. first removes the organic binders and plasticizers from the substrate layers and conductor/resistor pastes. After burnout, these parts are fired at much higher temperatures, which sinters and densifies the glass-ceramic substrate to form a dense and rigid insulating structure. Glass-forming constituents in the layers can flow and fill-in voids, corners, etc.

Two different cofired ceramic systems are conventionally used, depending on the choice of materials: high-temperature cofired ceramic (HTCC), and low-temperature cofired ceramic (LTCC). HTCC systems typically use alumina substrates; are printed with molybdenum-manganese or tungsten conducting traces; and are fired at high temperatures, from 1300 to 1800 C. LTCC systems use a wide variety of glass-ceramic substrates; are printed with Au, Ag, or Cu metallizations; and are fired at lower temperatures, from 600 C. to 1300 C. After firing, the semiconductor die is attached to the fired HTCC (or LTCC) body; followed by wirebonding. Finally, the package is lidded and sealed by attaching a metallic, ceramic, or glass cover lid with a braze, a frit glass, or a solder seal, depending on the hierarchy of thermal processing and on performance specifications.

Use of cofired multilayer ceramic structures for semiconductor packages advantageously permits a wide choice of geometrical designs and processing conditions, as compared to previous use of bulk ceramic pieces (which typically had to be cut and ground from solid blocks or bars). Ceramic packages with high-temperature seals are generally stronger and have improved hermeticity, compared to plastic encapsulated packages. It is well known to those skilled in the art that damaging moisture can penetrate polymer-based seals over time. Also, metallized conductive traces are more durable than freestanding wire bond segments, especially when the traces are embedded and protected within a layer of insulating material.

In summary, conventional methods and designs for packaging of light-sensitive microelectronic devices attach the window (or cover lid containing a window) after completing the steps of die attachment and wirebonding of the chip or MEMS device to the package. Many processing steps are used, which can expose the fragile MEMS structures to particulate contamination and mechanical damage during packaging.

What is needed is a packaging process that minimizes the number of times that a MEMS device is handled and exposed to temperature cycles and different environments, which can possibly lead to contamination of the device. This can be accomplished by performing as many of the package fabrication steps as possible before mounting the MEMS device. What is needed, then, is a packaging process that generally attaches the window to the package before mounting the chip or device to the package. It is also desired that the window be attached to the package body at a high temperature to provide a strong, hermetic bond between the window and the body. What also is needed is a method where the MEMS device faces away from the cover lid, so that contamination is reduced when the cover lid is attached last. A process is needed that provides for releasing MEMS structures after the MEMS device has been mounted to the package, but before attaching the window.

Electrical interconnections from the chip or device to the package are needed that are stronger and less fragile than conventional wirebonds. What also is needed is a package having a high degree of strength and hermeticity. In some cases, it is also desired to stack back-to-back multiple chips, of different types (e.g. CMOS, MEMS, etc.) inside of a single, windowed-package on multiple levels.

Use of the phrase "MEMS devices" is broadly defined herein to include "IMEMS" devices, unless specifically stated otherwise. The word "plastic" is broadly defined herein to include any type of flowable, dielectric composition, including polymer compounds and spin-on glass-polymer compositions. The phrases "released MEMS structures", "released MEMS elements", and "active MEMS elements" and "active MEMS structures" are used interchangeably to refer to a device having freely-movable structural elements, such as gears, pivots, hinges, sliders, tilting mirrors; and also to exposed active elements such as chemical sensors, flexible membranes, and beams with thin-film strain gauges, which are used in accelerometers and pressure sensors.

BRIEF DESCRIPTION OF THE DRAWINGS

The accompanying drawings, which are incorporated in and form part of the specification, illustrate various examples of the present invention and, together with the description, serve to explain the principles of the invention.

FIG. 10B shows a third step of a schematic cross-section view of a first example of a method of packaging a microelectronic device in a package having an integral window according to the present invention that is similar to the first example of FIG. 3.

DETAILED DESCRIPTION OF THE INVENTION

The present invention relates to a method of fabricating a package having an integral window, for packaging at least one microelectronic device. The present invention also relates to a method of packaging at least one microelectronic device inside a package having an integral window. The present invention also relates to a method of packaging MEMS devices wherein the MEMS device is released after mounting, but before attaching the window.

It should be noted that the examples of the present invention shown in the figures are sometimes illustrated with the window facing down, which is the preferred orientation during flip-chip bonding. However, those skilled in the art will understand that the completed package can be oriented for use with the window facing upwards. It should also be noted that all of the figures show only a single microelectronic device, illustrated as a microelectronic device, or as a pair of chips or devices. It is intended that the method of the present invention should be understood by those skilled in the art that the present invention can be applied equally to fabricating a package for packaging a plurality of chips in a one-dimensional or a two-dimensional array, as in a multi-chip module (MCM), including multiple windowed-compartments, including having a window on either side of the package.

Figure 1:
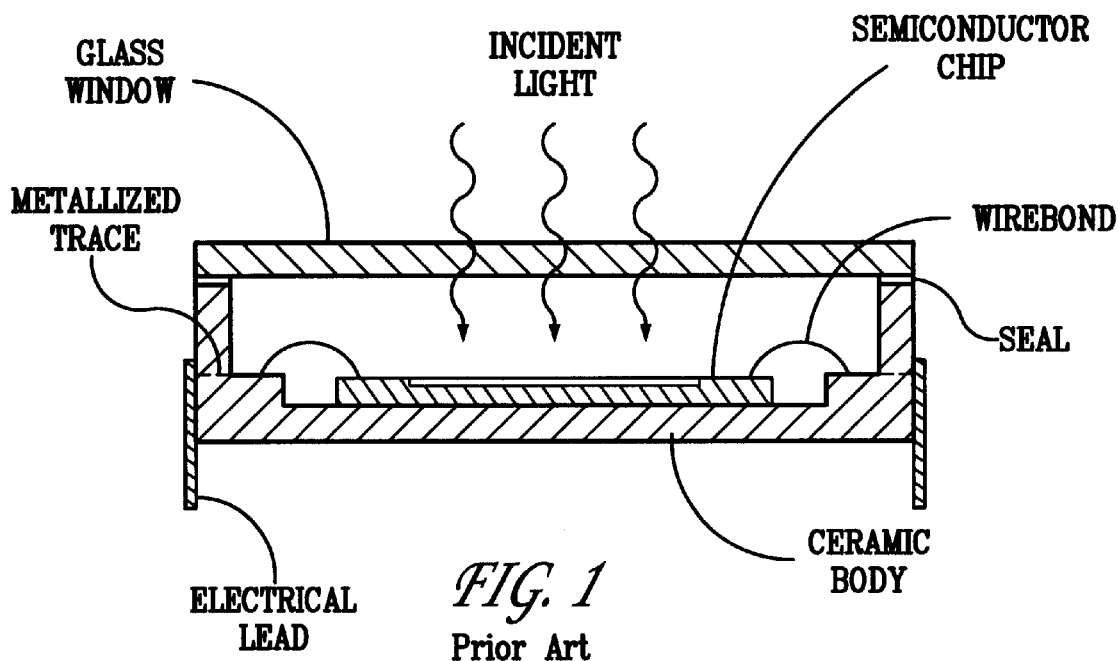
FIG. 1 shows a schematic cross-section view of a conventional ceramic microelectronic package, where the window or cover lid is attached last, after the microelectronic device has been joined (face-up) to the base and wirebonded.
Figure 2:
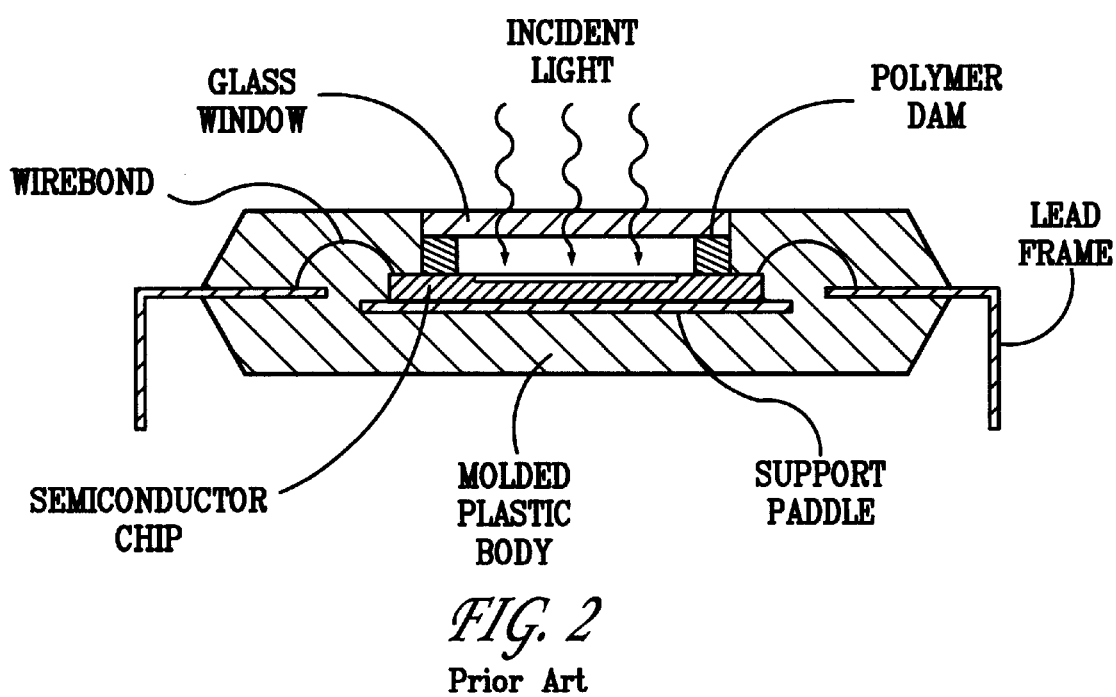
FIG. 2 shows a schematic cross-section view of a conventional plastic molded microelectronic package, where the microelectronic device, lead frame, and window are encapsulated in a plastic body by a transfer molding process.
Figure 3:
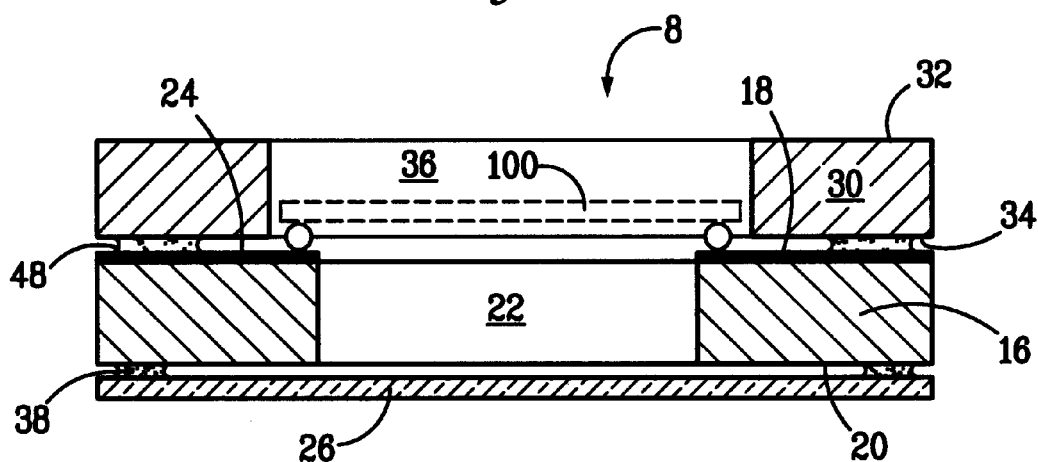
FIG. 3 shows a schematic cross-section view of a first example of a microelectronic package according to the present invention, with the package having an integral window including an first plate, a second plate, metallized trace, and an attached window.

FIG. 3 shows a schematic cross-section view of a first example of a package 8 for packaging at least one microelectronic device according to the present invention, comprising an package 10 of electrically insulating plates. Package 10 of FIG. 3 comprises a first plate 16, having a first surface 20, an opposing second surface 18, and a first aperture 22 through plate 16. Plate 16 also has an electrically conductive metallized trace 24 disposed on surface 18. Plate 16 further comprises a window 26 bonded to plate 16, for providing optical access to a microelectronic device 100 that would be inserted inside package 10.

In FIG. 3, package 10 further comprises a second plate 30, which has a third surface 34, an opposing fourth surface 32, and a second aperture 36 through plate 30 for providing access to insert a microelectronic device into package 10. First plate 16 is attached to second plate 30 by joining surface 18 to surface 34, whereby package 10 is formed. At least one lateral dimension of aperture 36 is larger than the corresponding lateral dimension of aperture 22. Aperture 22 can be substantially aligned with aperture 36. The lateral dimensions of aperture 36 are larger than the lateral dimensions of microelectronic device 100, so that a device 100 can be inserted easily inside of apertures 36 and 22. Microelectronic device 100 can comprise a microelectronic device 100.

In FIG. 3, the shape of aperture 22 and aperture 36 can be polygonal (e.g. square or rectangular) or circular. Aperture 22 can have a different shape than aperture 36. The horizontal surfaces of plate 16, plate 18, and window 26 can all be substantially coplaner. The attachment of window 26 to plate 16 can comprise a first seal 38 disposed in-between window 26 and plate 16. Seal 38 can have an annular shape. Likewise, the attachment of plate 16 to plate 18 can comprise a second seal 48 disposed in-between surface 18 and surface 34. Seal 48 can also have an annular shape, either the same or different than the shape of seal 38.

We turn now to describing the first example of a method of fabricating a package for packaging at least one microelectronic device according to the present invention, comprising forming an package 10 of electrically insulating plates. These steps are illustrated schematically in FIGS. 4A–4E.

Figure 4A:
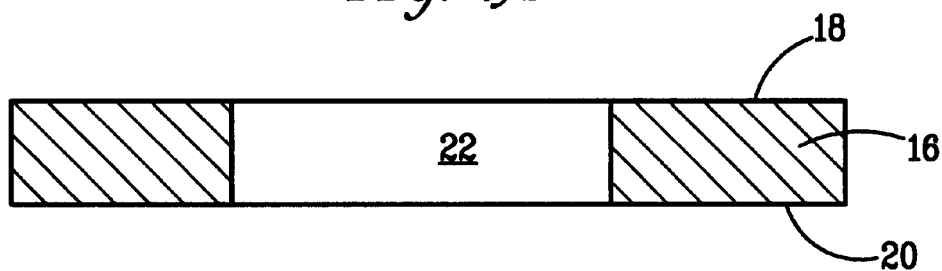
FIG. 4A shows a first step in fabricating the first example of a microelectronic package according to the example shown in FIG. 3 of the present invention.
Figure 4B:
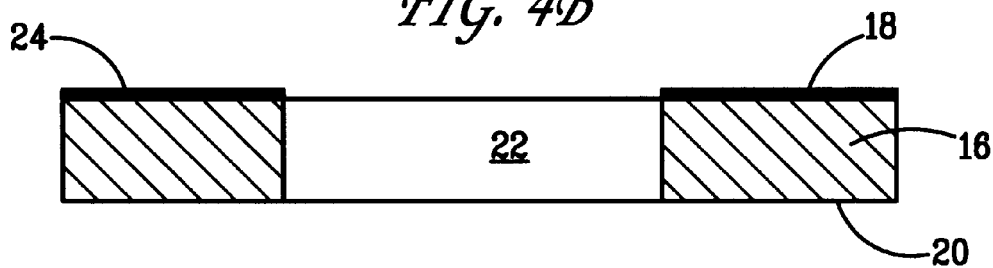
FIG. 4B shows a second step in fabricating the first example of a microelectronic package according to the example shown in FIG. 3 of the present invention.
Figure 4C:
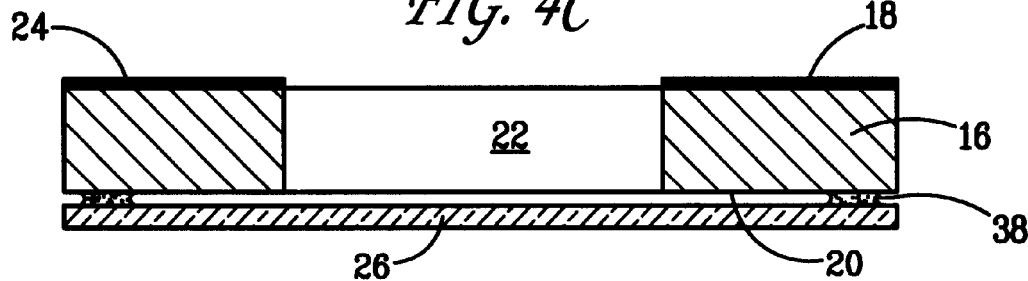
FIG. 4C shows a third step in fabricating the first example of a microelectronic package according to the example shown in FIG. 3 of the present invention.
Figure 4D:
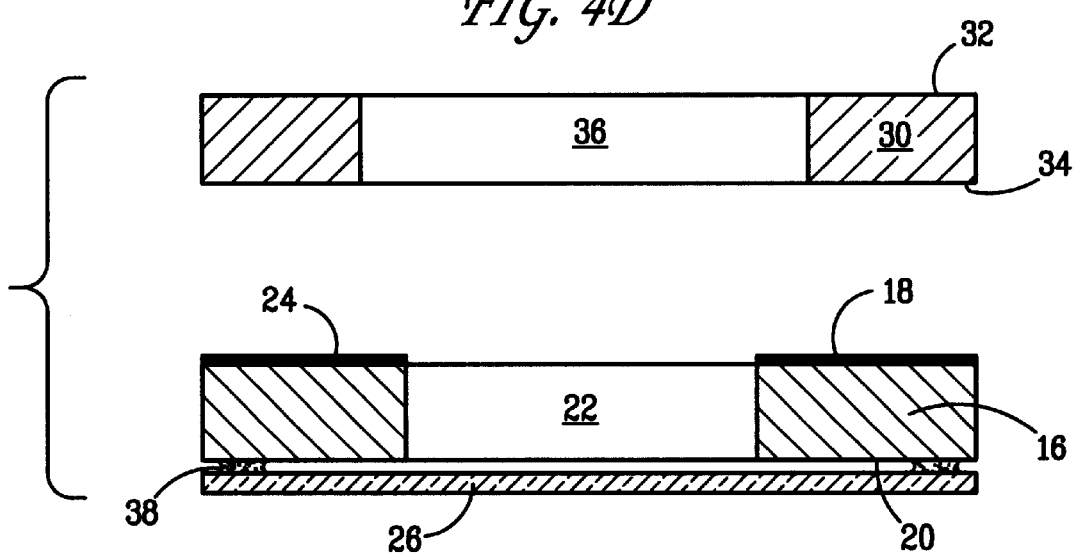
FIG. 4D shows a fourth step in fabricating the first example of a microelectronic package according to the example shown in FIG. 3 of the present invention.

In FIG. 4A, first plate 16 is formed, having a first surface 20, an opposing second surface 18, and a first aperture 22 disposed through plate 16. In FIG. 4B, an electrically conductive metallized trace 24 is fabricated on top of second surface 18. In FIG. 4C, window 26 is attached to first surface 20. This first attachment can comprise using a first seal 38. In FIG. 4D, second plate 30 is formed, having a third surface 34, an opposing fourth surface 32, and a third aperture 36, wherein the second aperture 36 is larger than, and can be substantially aligned with, the first aperture 22. Finally, in FIG. 4E, second plate 30 is attached to first plate 16 by joining second surface 18 to third surface 34, whereby package 8 comprising package 10 is fabricated. This second attachment can comprise using a second seal 48. Optionally, the step of fabricating an electrically conductive metallized trace on second surface 18 can be performed after the step of attaching window 26 to plate 16.

In FIGS. 4A and 4D, the steps of forming the first plate 16 and second plate 30 can comprise fabrication methods that depend on the type of electrically insulating materials used. Examples of electrically insulating materials include: a ceramic, a polymer, a plastic, a glass, a glass-ceramic composite, a glass-polymer composite, a resin material, a fiber-reinforced composite, a glass-coated metal, or a printed wiring board composition. The ceramic materials can comprise alumina, beryllium oxide, silicon nitride, aluminum nitride, titanium nitride, titanium carbide, or silicon carbide. Fabrication of ceramic plates can be performed by processes well-known to those skilled in the art (e.g. cold-isostatic pressing followed by hot-isostatic pressing, uniaxial pressing followed by sintering, slip casting, machining of a green ceramic body followed by sintering, waterjet cutting of ceramic sheets, rapid forging, grinding, lapping, and combinations thereof. Fabrication of polymer (e.g. plastic) plates can be performed by processes well-known to those skilled in the art (e.g. transfer molding, conventional machining of a solid body, water-jet and laser cutting of sheet or plate material, machining of printed wiring board sheets, and injection molding).

Figure 4E:
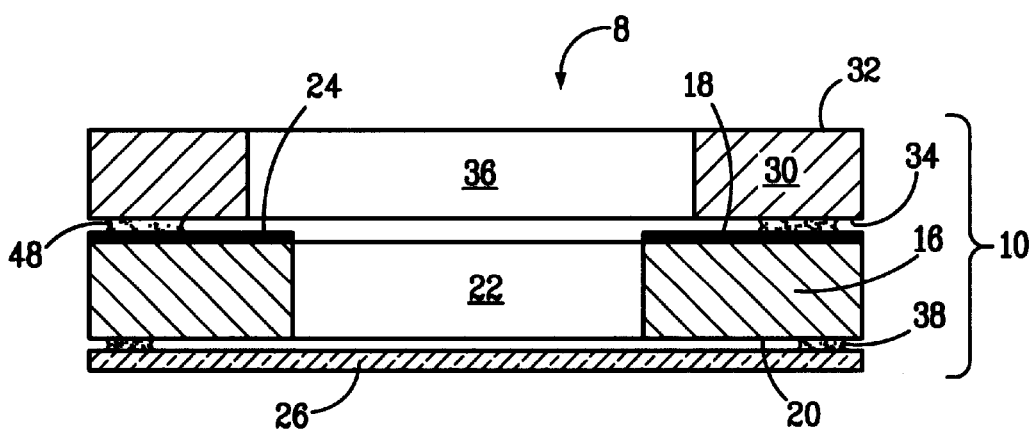
FIG. 4E shows a fifth step in fabricating the first example of a microelectronic package according to the example shown in FIG. 3 of the present invention.
Figure 5:
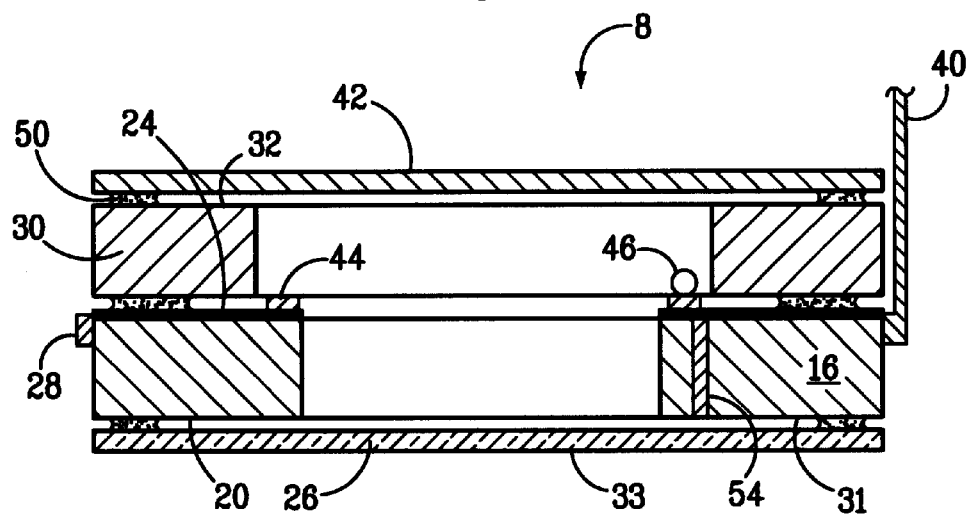
FIG. 5 shows a schematic cross-section view of a second example of a method of fabricating a microelectronic package according to the present invention, including optional features.

FIG. 5 a second example of the present invention, illustrating schematically some additional processing steps that can be optionally used, either individually, or in combination, on package 10 shown in FIG. 4E of the first example of FIG. 3, according to the present invention. An anti-reflection coating 33 can be applied to either side (or both) of window 26, to reduce reflections and/or improve transmission of light through the window. A surface treatment 31 (e.g. thin-film coatings or controlled surface roughness) can be applied to one or more mating surfaces, for example, to surface 20, to improve wettability of molten solders and brazes, and to improve adhesion of polymers or sealing glasses to the corresponding opposing mating surface (e.g. window 26). An electrical lead 40 can be attached to metallized trace 24 on an exterior location of plate 16.

In FIG. 5, bonding pad 28 can also be attached to metallized trace 24 on an exterior location of plate 16, to provide an appropriate surface for attaching a wire or electrical lead. A second bond pad 44 can be attached to metallized trace 24 at an interior location on surface 18 to provide an appropriate surface for attaching a wire lead or an interconnect bump 46. Optional interconnect bump 46 can comprise an electrically conductive material (e.g. gold, gold alloy, aluminum, solder, and silver-filled epoxy) or a non-conducting, adhesive material (e.g. epoxy resin, polyimide, silicone, or urethane).

In FIG. 5, electrically conductive via 54 can be fabricated into plate 16, for providing an electrically conductive path between first surface 20 and second surface 18. Via 54 can be made electrically conducting by filling a hole with metallized paste, solder, or other flowable, electrically conducting material. A cover lid 42 can be attached to fourth surface 32, for sealing package 10, thereby completing package 8. The attachment between cover lid 42 and plate 30 can comprise using a third seal 50. Seal 50 can have an annular shape.

The attachment methods referred to above can comprise using a joining process (e.g. brazing, frit glass sealing, glass-ceramic sealing, ceramic-polymer sealing, glass-polymer sealing, reflow soldering, plasma-assisted dry soldering, and attaching with adhesives). The corresponding joining material that can be used for seals 38, 48 or 50 can comprise a hermetic sealant (e.g. a braze alloy, a frit glass compound, a glass-ceramic composite, a glass-polymer compound, a ceramic-polymer compound, or a solder alloy) or an adhesive material (e.g. an epoxy resin, a polyimide adhesive, a silicone adhesive, or a urethane adhesive). Selection of a preferred sealant should take into consideration the hierarchy of thermal processing for the entire packaging process. The phrase "thermal hierarchy" means that the highest temperature processes (e.g. sintering, joining, etc.) are performed first, followed by progressively lower temperature processes, with the lowest temperature process being performed last in the sequence of fabrication steps.

In FIG. 5, cover lid 42 can include a second window (not shown in FIG. 5), for providing optical access through aperture 36. The second window can be attached to cover lid 42 either before or after attaching cover lid 42 to plate 30. Optionally, the ambient air inside of sealed package 8 can be substantially removed before attaching cover lid 42, and replaced with at least one gas other than air. This other gas can include an inert gas (e.g. argon, nitrogen, or helium). Helium can be easily detected by a conventional helium leak detector, thereby providing information on the hermetic quality of the joints and seals in package 8. The level of humidity can also be adjusted prior to sealing package 8 by attaching cover lid 42.

Window 26 can comprise an optically transparent material (e.g. a borosilicate glass, a quartz glass (i.e. fused silica), a low-iron, a leaded glass, a tempered glass, a low thermal-expansion glass, or a transparent ceramic, such as sapphire). Alternatively, a transparent plastic or polymer-based material can be used (e.g. PMMA). Some plastics are transparent in the UV spectrum. Silicon can be used for windows that are transparent in the IR spectrum. Preferably, the window's coefficient of thermal expansion (CTE) is about equal to the CTE of plate 16. Alternatively, the mismatch in CTE between window 26 and plate 16 can be chosen advantageously so that window 26 is placed in compression. Window 26 can optionally comprise optical quality properties (e.g. purity, flatness, and smoothness). Window 26 can comprise means for filtering selected wavelengths of light. Window 26 can comprise coloring dyes, or other elements, to form a material that can filter light, as is well-known to the art. Window 26 can also be made of a metal or metal alloy, for use in packaging of a microelectronic device used for detecting energetic particles.

Figure 6A:
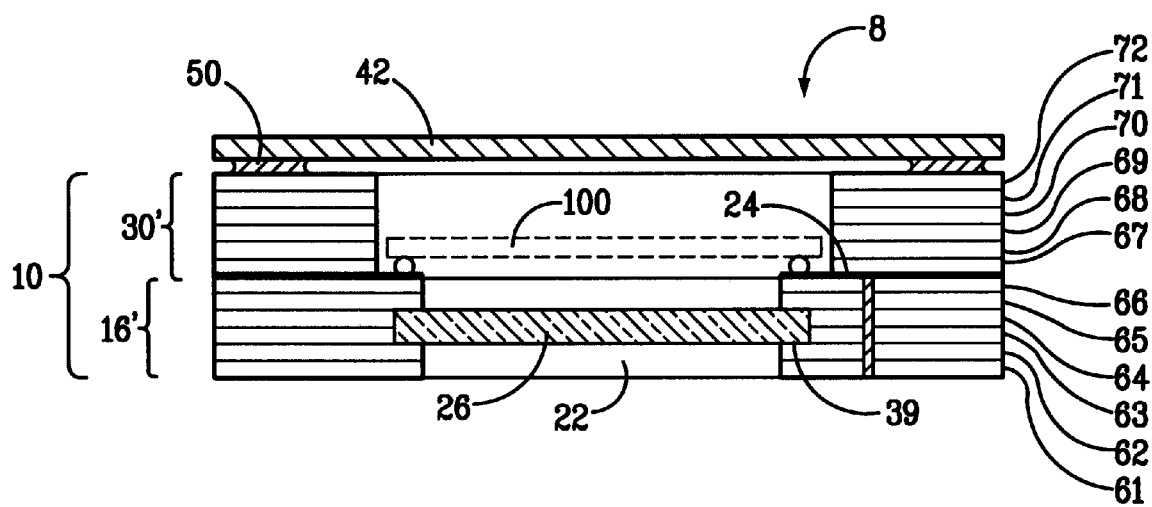
FIG. 6A shows a schematic cross-section view of a third example of a method of fabricating a microelectronic package according to the present invention, comprising cofiring a window along with a multilayered lamination of twelve individual layers, followed by optionally attaching a cover lid.
Figure 6B:
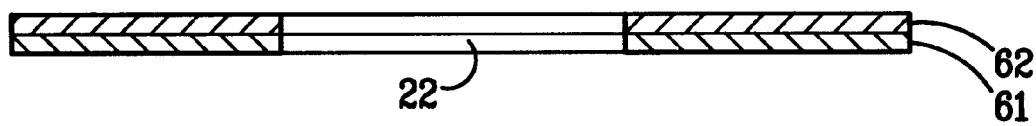
FIG. 6B shows a first step in fabricating the third example of a microelectronic package according to the example shown in FIG. 6A of the present invention.
Figure 6C:
FIG. 6C shows a second step in fabricating the third example of a microelectronic package according to the example shown in FIG. 6A of the present invention.
Figure 6D:
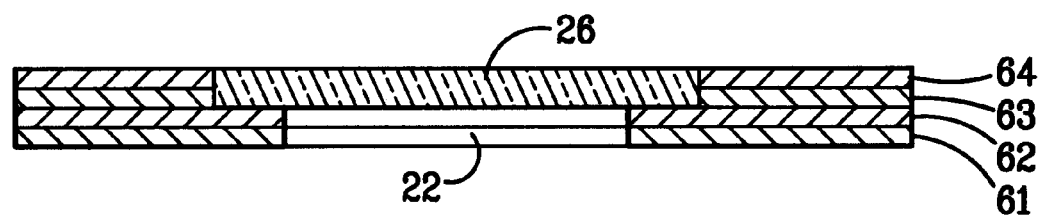
FIG. 6D shows a third step in fabricating the third example of a microelectronic package according to the example shown in FIG. 6A of the present invention.
Figure 6E:
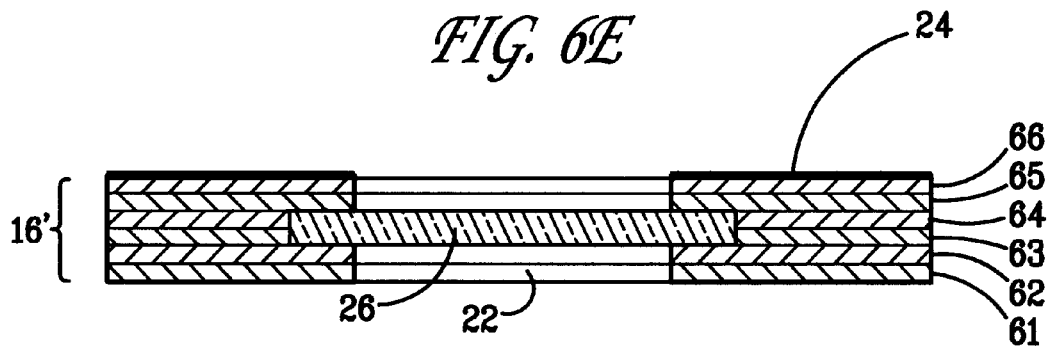
FIG. 6E shows a fourth step in fabricating the third example of a microelectronic package according to the example shown in FIG. 6A of the present invention.
Figure 6F:
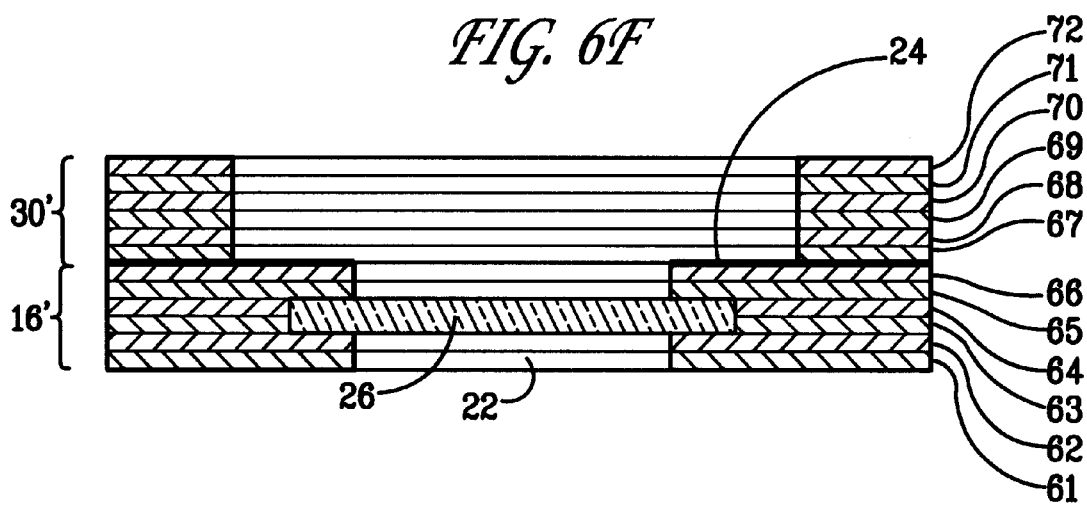
FIG. 6F shows a fifth step in fabricating the third example of a microelectronic package according to the example shown in FIG. 6A of the present invention.
Figure 6G:
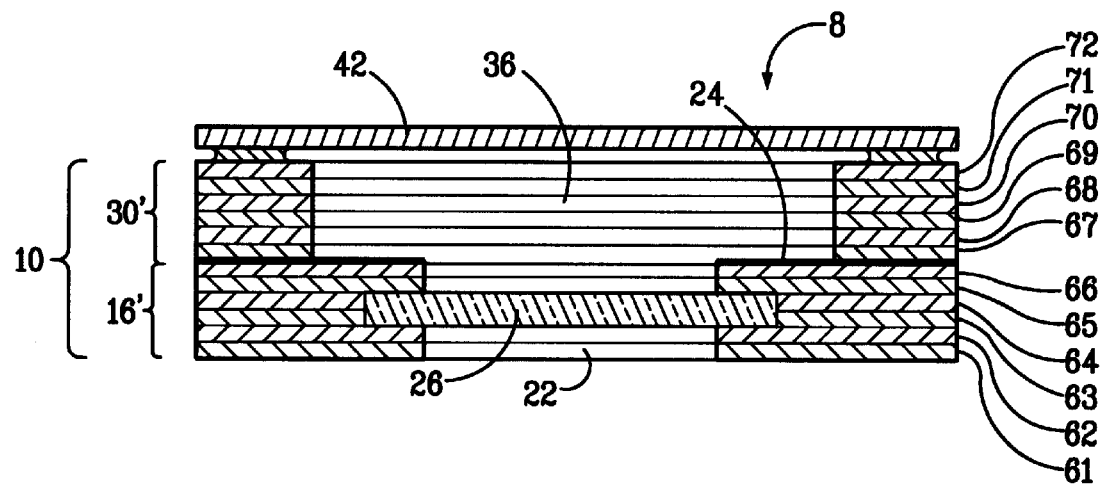
FIG. 6G shows a sixth step in fabricating the third example of a microelectronic package according to the example shown in FIG. 6A of the present invention.

FIG. 6A shows a schematic cross-section view of a third example of a method of fabricating a package having an integral window for packaging at least one microelectronic device according to the present invention, comprising forming an package 10 of electrically insulating plates. In the example shown in FIG. 6A, a total of twelve individual layers (e.g. sheets) can be stacked and bonded together (e.g. laminated) to form a multilayered package 10. The layers can comprise polymer or glass-ceramic materials.

For storing and operating microelectronic devices in severe environments, ceramic packages are preferred because they are generally stronger and more hermetic than plastic encapsulated packages. The ceramic layer is created by casting a blend of ceramic and glass powders, organic binders, plasticizers, and solvents into sheets or tapes (e.g. tape casting). The organic components provide strength and flexibility to the green (e.g. unfired) sheets during handling. The tape-cast sheets are then personalized by cutting out individual sheets having the appropriate outside perimeter and inside aperture shape. This can be done by punching, water-jet cutting, and laser cutting. Patterns of conductive metallized pastes or inks can optionally be deposited on an individual sheet by using a thick-film screen-printing process. Thick-film resistors can be deposited at this stage. Vias for connecting individual signal layers (e.g. layers with conductive traces) can be machined into each sheet by punching, drilling, or ablating with lasers. The sheets are then stacked, registered and held as a rigid assembly. Burnout is then performed by baking at a relatively low temperature (e.g. 350–600 C.), which removes the organic binders and plasticizers from the individual sheets and conductor/resistor pastes. After burnout, these parts are fired at much higher temperatures, which sinters and densifies the glass-ceramic substrate to form a dense, rigid, insulating structure. Glass-forming constituents in the layers can flow and advantageously fill-in voids, corners, etc inside a holding fixture. Because all of the individual sheets of tape-cast ceramic material are baked and fired simultaneously, the product made by this process is conventionally designated as a cofired ceramic multilayered material.

Two different cofired ceramic multilayer systems are conventionally used, depending on the choice of materials and processing temperatures: high-temperature cofired ceramic (HTCC), and low-temperature cofired ceramic (LTCC). If the ratio of ceramic to glass is high (9/1, or greater), the green substrate layer can only be sintered (e.g. densified) at high firing temperatures (e.g. 1300 to 1800 C.). Consequently, the thick-film pastes (e.g. to form metallized trace 24) that are typically cofired with the substrate also have to withstand these high temperatures, such as tungsten, or alloys of molybdenum and manganese. The dielectric consists of glass fillers in a ceramic matrix. During firing a glassy phase is formed from the presence of various oxides in the ceramic. This system is referred to as HTCC.

Alternatively, the dielectric can be a ceramic-filled glass matrix, which can be sintered at much lower firing temperatures (e.g. 600 to 1300 C.). Thick-film metallization can comprise high-conductivity metals, such as gold, silver, copper, silver-palladium, and platinum-gold. This system is referred to as LTCC.

If ceramic packaging is not required, then polymer-based materials can be used. Multilayer printed wiring board (PWB) materials can be used for constructing package 10. In this system, metallized trace 24 is fabricated by using an etched-foil process, well-known to those skilled in the art. Similar to cofired ceramic multilayers, the multiple layers of PWB composition are stacked and laminated under pressure and temperature in a single, simultaneous bonding step (e.g. co-bonded) to form a multilayered package 10.

The fabrication method illustrated in FIGS. 6A–6G readily accommodates the preferred stepped surface profile of the interior apertures of package 8, as required to hold window 26 and device 100, because the individual layers are easily machined into shapes of varying sizes that can be stacked and laminated to form a cofired ceramic multilayered package 10. For example, FIG. 6A shows an arrangement for integrating window 26 into first plate 16 comprising an encased joint 39. If a bulk ceramic plate were used for plate 16, it would be very difficult to manufacture such a reentrant, recessed feature for packaging the edges of window 26 therein. However, by using a laminated, multilayered construction, this is relatively easy to do (as will be explained shortly).

In FIGS. 6A–6G, the method of forming package 10 comprises laminating twelve individual layers of ceramic tape stacked and laminated to form a monolithic, unitized body having an integral window. The part of package 10 grouped as plate 16' (see FIG. 6F) comprises six individual layers (e.g. sheets) of glass-ceramic tape (e.g. layers 61, 62, 63, 64, 65, and 66). Likewise, the part of package 10 grouped as plate 30' (see FIG. 6F) comprises six additional individual layers (e.g. layers 67, 68, 69, 70, 71, and 72). Each layer can be individually personalized with the appropriate inside and outside dimensions. Metallized trace 24 can be deposited on the upper surface of layer 66 (corresponding to surface 18 of FIG. 3) prior to stacking of the individual layers. Window 26 can be inserted into the stack of layers after the surrounding layers 61, 62, 63, and 64 have been stacked and registered. The remaining eight layers (e.g. 65–72) can be stacked and registered after window 26 has been inserted. Then, the entire stack of twelve layers (e.g. 61–72) can be clamped and cofired at the appropriate temperature and pressure (e.g. HTCC or LTCC) for the required time to form a unitized, monolithic body including an integral window 26.

In FIGS. 6A–6G, it is not necessary to join plate 16' to plate 30' with a separate seal 48 because this "joint" is made simultaneously with all of the other layers during the cofiring (or co-bonding) process.

However, those skilled in the art will understand that an alternative method is to fabricate individual plates 16' and 30', each separately by the same process of cofiring multilayered construction. For example, referring again to FIG. 6F, plate 16' could be fabricated by cofiring layers 61, 62, 63, 64, 65, and 66, including window 26 and metallized trace 24 deposited on layer 66. Then, in a separate process (either before or after, or in a separate fixture inside the same furnace) plate 30' could be fabricated by cofiring layers 67, 68, 69, 70, 71, and 72. Finally, plates 16' and 30' can be bonded together using a non-conductive seal 48 (as in FIG. 3). Use of a non-conductive sealant for seal 48 is required in this example in order to electrically isolate multiple conductive traces 24.

In a variation of the process described immediately above, cover lid 42 could be cofired and laminated to cofired plate 30' in a single furnace run. This would eliminate the need for attaching the cover lid with seal 50. Lastly, plate 16' with cofired window 26 could be attached to plate 30' using a non-conductive seal 48 (as in FIG. 3). Use of a non-conductive sealant for seal 48 is also required in this example in order to electrically isolate multiple conductive traces 24.

An advantage of cofiring the entire stack of twelve layers (e.g. 61–72) in FIG. 6 at the same time is that metallized conductive trace 24 becomes embedded in a rigid and strong electrically insulating material that protects a large portion of the trace from being damaged, broken, or bridged (e.g. short circuited).

Figure 7A:
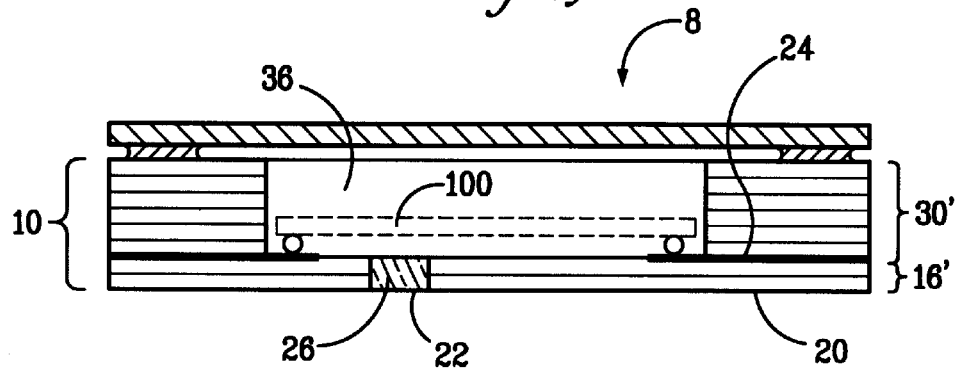
FIG. 7A shows a schematic cross-section view of a fourth example of a method of fabricating a microelectronic package according to the present invention. A cofired window substantially fills up the aperture through the first plate.

Those skilled in the art will understand that other thicknesses for plates 16' and 30' can be formed by laminating a different number of layers of the cofired ceramic multilayered material (or co-bonded PWB material). For example, a fourth example of the present invention, shown in FIG. 7A, illustrates an example where plate 16' can be formed having a fewer number of layers (e.g. two layers: 63 and 64). In this case, aperture 22 is substantially filled up by window 26. In this example, window 26 can be fabricated integrally with plate 16' by casting molten glass, or by molding a liquid polymer, directly into aperture 22.

In the example shown in FIG. 7A, the size of aperture 22 (and, hence, window 26) is much smaller than the size of chip or device 100. It is not required that the size of window 26 be similar to the size of aperture 22. Also, the example of FIG. 7A shows that the centerline of aperture 22 does not align with the centerline of aperture 36, e.g. aperture 22 is offset from aperture 36. It is not required that aperture 22 be aligned with aperture 36. However, aperture 22 can be substantially aligned with aperture 36. Those skilled in the art will understand that more than one small aperture 22 can be included in plate 16', for providing multiple locations for providing optical access to chip or device 100.

Figure 7B:
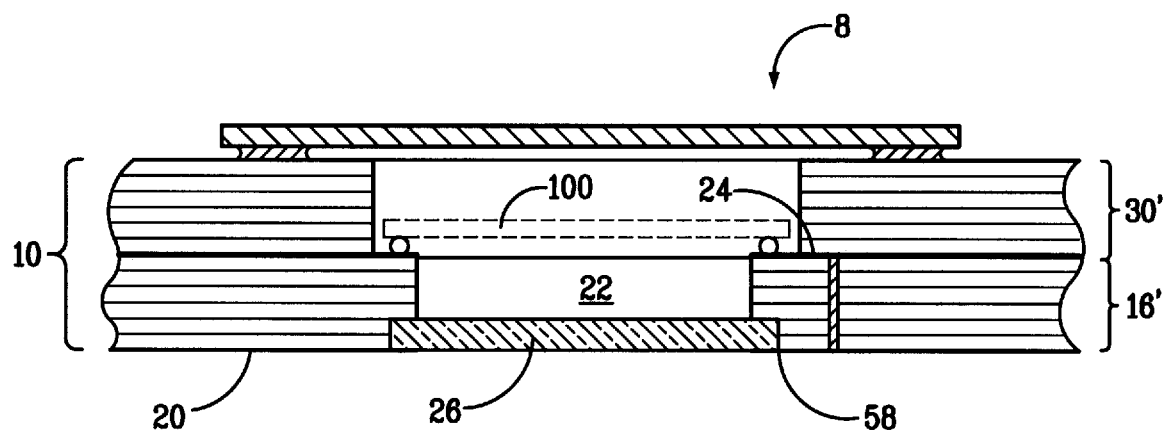
FIG. 7B shows a schematic cross-section view of a fifth example of a method of fabricating a microelectronic package according to the present invention. A cofired window substantially fills up the aperture through the first plate.

FIG. 7B shows a schematic cross-section view of a fifth example a method of fabricating a package having an integral window for packaging at least one microelectronic device according to the present invention, comprising forming an package 10 of electrically insulating plates. The fifth example of the method shown in FIG. 7B is similar to the third example of FIG. 6, but with window 26 attached to recessed lip 58 formed inside of plate 16', wherein lip 58 can be recessed in a direction away from second surface 20 of first plate 16'. Recessed lip 58 can be formed easily by using the process of cofired multilayered construction (ceramic or polymer-based), as described previously. FIG. 7B also illustrates that plates 16' and 30' can extend laterally an unlimited distance beyond the immediate material surrounding apertures 22 and 36.

Alternatively, the width of plates 16' and 30' can be limited to extending only a short distance beyond the apertures 22 and 36, as illustrated in FIG. 7A. In this example, plates 16' and 30' can be considered to be a frame for a package that might be housing a single device or chip.

Figure 7C:
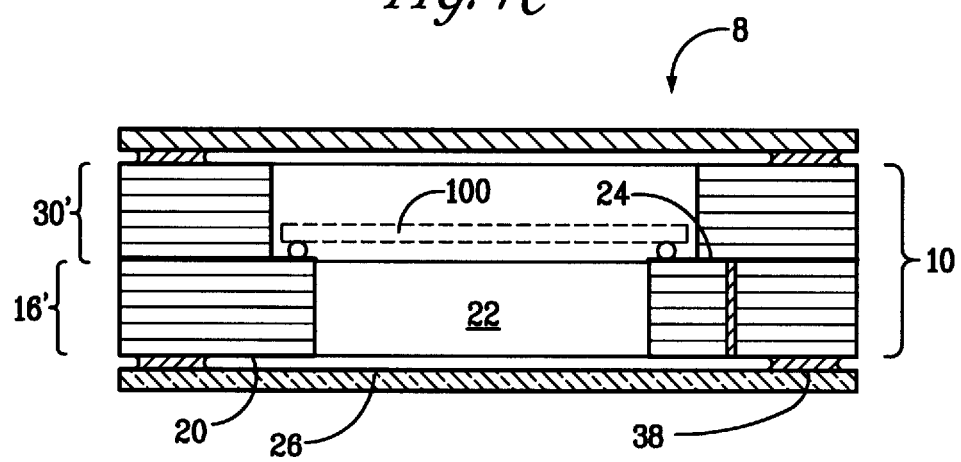
FIG. 7C shows a schematic cross-section view of a sixth example of a method of fabricating a microelectronic package according to the present invention. A cofired window is mounted flush to the first surface of the first plate.

FIG. 7C shows a schematic cross-section view of a sixth example a method of fabricating a package having an integral window for packaging at least one microelectronic device according to the present invention, comprising forming an package 10 of electrically insulating plates. The method shown in FIG. 7C is similar to FIG. 6, but with window 26 attached flush to second surface 20 of first plate 16. Window 26 can be attached to plate 16' with seal 38. Seal 38 can comprise a hermetic sealant material or an adhesive material, as described previously. Alternatively, window 26 can be cofired simultaneously along with plates 16' and 30'.

Figure 8:
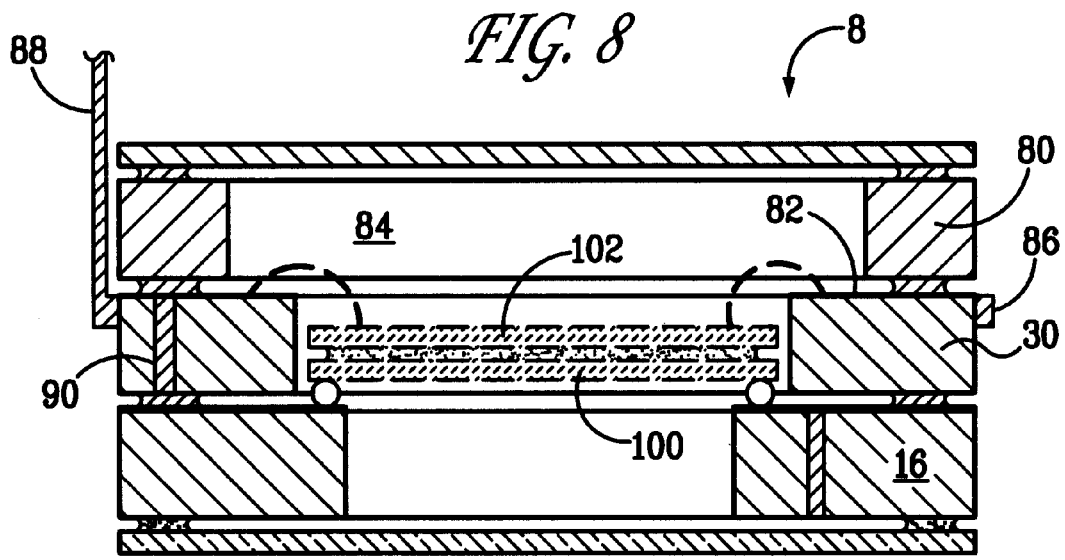
FIG. 8 shows a schematic cross-section view of a seventh example of a method of fabricating a microelectronic package according to the present invention, with the package having an integral window cofired to a cofired multilayered package including an first plate, a second plate, a third plate, and an attached cover lid.

FIG. 8 shows a schematic cross-section view of a seventh example a method of fabricating a package having an integral window for packaging at least one microelectronic device according to the present invention, comprising forming an package 10 of electrically insulating plates. The method shown in FIG. 8 is similar to the first example of FIG. 3; wherein forming package 10 further comprises fabricating a second electrically conductive metallized trace 82 disposed on third surface 34 of plate 30; attaching a third plate 80 to third surface 34, wherein plate 80 includes a third aperture 84 through plate 80; and further wherein at least one lateral dimension of aperture 84 is larger than the corresponding lateral dimension of aperture 36; and wherein aperture 84 can be substantially aligned with aperture 36. The method of FIG. 8 can further comprise attaching a second bond pad 86 or second electrical lead 88 to metallized trace 82. The method of FIG. 8 can further comprise forming a second electrically conductive via 90 inside plate 30. Those skilled in the art will understand that additional plates having apertures and metallized traces can be stacked on top of previous plates, to construct as many levels as is needed.

Figure 9A:
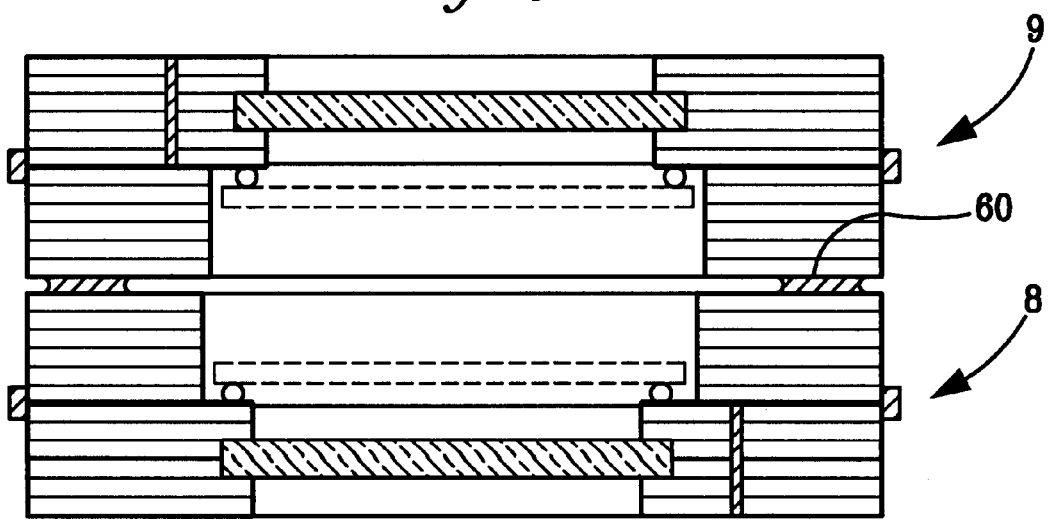
FIG. 9A shows a schematic cross-section view of a eighth example of a method of fabricating a microelectronic package according to the present invention that is similar to the first example of FIG. 3, but with the cover plate removed, and also having a second package, substantially identical to the first example of FIG. 3 (also without a cover plate), where the second package has been inverted and joined to the first package, thereby forming a substantially symmetric package.

FIG. 9A shows a schematic cross-section view of a eighth example a method of fabricating a package having an integral window for packaging at least one microelectronic device according to the present invention. The method of FIG. 9A further comprises forming a second package 9 that is substantially identical to the first example of package 8 shown in FIG. 3; inverting second package 9, and bonding it with seal 60 to package 8 to form a sealed, symmetric package capable of packaging at least two microelectronic devices. In this example, second package 9 serves the function of cover lid 42 (e.g. to cover and seal package 8).

Figure 9B:
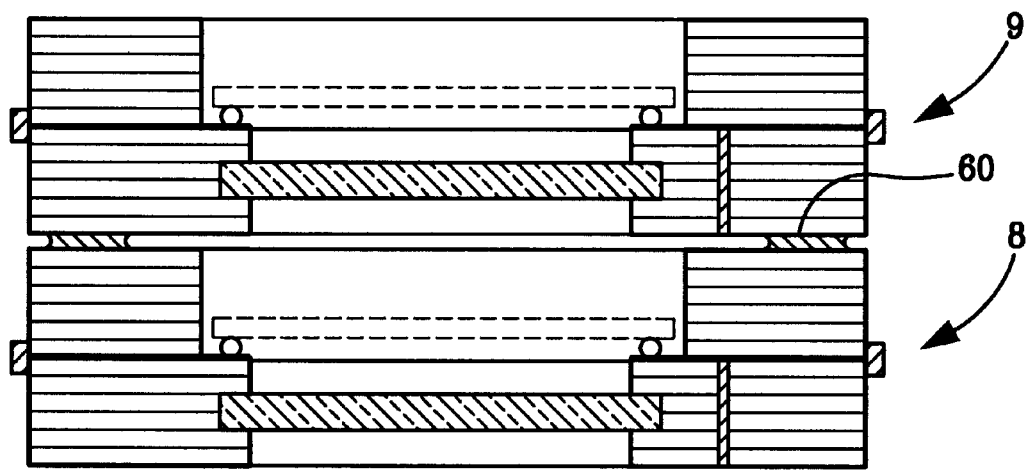
FIG. 9B shows a schematic cross-section view of an ninth example of a method of fabricating a microelectronic package according to the present invention that is similar to the first example of FIG. 3, but with the cover plate removed, and also having a second package, substantially identical to the first example of FIG. 3 (also without a cover plate), where the second package has been stacked above the first package and joined to the first package, thereby forming a stacked, double-package.

FIG. 9B shows a schematic cross-section view of a ninth example a method of fabricating a package having an integral window for packaging at least one microelectronic device according to the present invention. The method of FIG. 9B further comprises forming a second package 9 that is substantially identical to the first example of package 8 shown in FIG. 3; stacking and bonding second package 9 with seal 60 to package 8 to form a sealed, double-stacked package capable of packaging at least two microelectronic devices.

Figure 9C:
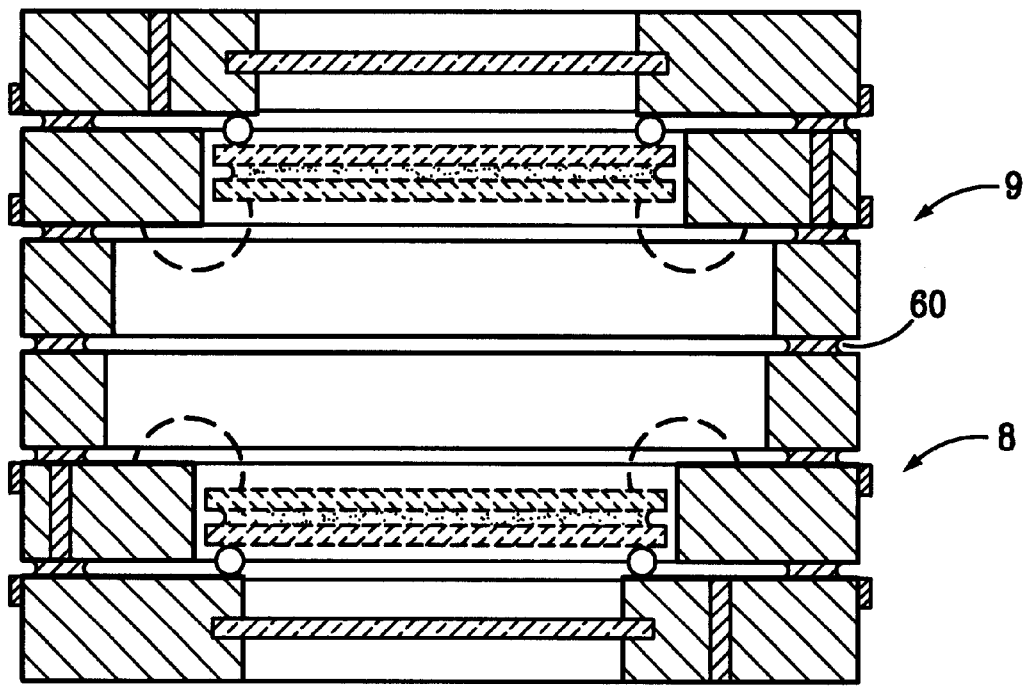
FIG. 9C shows a schematic cross-section view of a tenth example of a method of fabricating a microelectronic package according to the present invention that is similar to the seventh example of FIG. 8, but with the cover plate removed, and also having a second package, substantially identical to the seventh example of FIG. 8 (also without a cover plate), where the second package has been inverted and joined to the first package, thereby forming a substantially symmetric package.

FIG. 9C shows a schematic cross-section view of a tenth example a method of fabricating a package having an integral window for packaging at least one microelectronic device according to the present invention. The method of FIG. 9C further comprises forming a second package 9 that is substantially identical to the seventh example of package 8 shown in FIG. 8; inverting second package 9, and bonding it with seal 60 to package 8 to form a sealed, symmetric package capable of packaging at least two microelectronic devices. In this example, second package 9 serves the function of cover lid 42 (e.g. to cover and seal package 8).

Figure 9D:
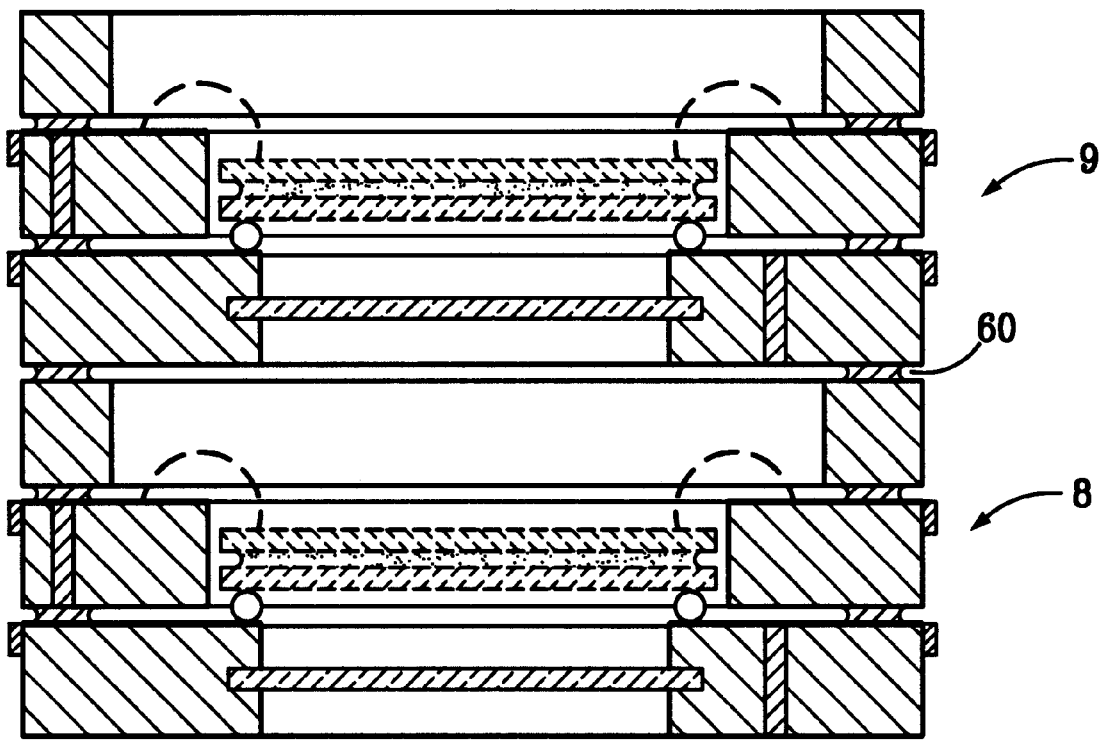
FIG. 9D shows a schematic cross-section view of a eleventh example of a method of fabricating a microelectronic package according to the present invention that is similar to the seventh example of FIG. 8, but with the cover plate removed, and also having a second package, substantially identical to seventh example of FIG. 8 (also without a cover plate), where the second package has been stacked above the first package and joined to the first package, thereby forming a stacked, double-package.

FIG. 9D shows a schematic cross-section view of a eleventh example a method of fabricating a package having an integral window for packaging at least one microelectronic device according to the present invention. The method of FIG. 9D further comprises forming a second package 9 that is substantially identical to seventh example of package 8 shown in FIG. 8; stacking and bonding second package 9 with seal 60 to package 8 to form a sealed, double-stacked package capable of packaging at least two microelectronic devices.

Figure 9E:
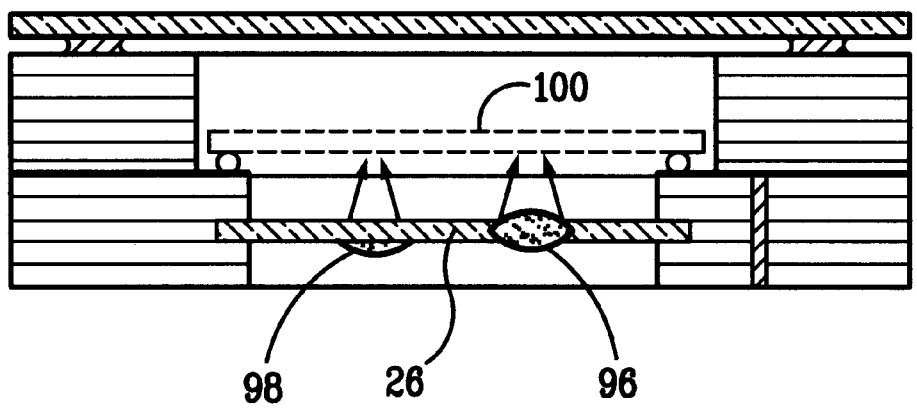
FIG. 9E shows a schematic cross-section view of a twelfth example of a method of fabricating a microelectronic package according to the present invention that is similar to the first example of FIG. 3. One or more lens can be attached to the window, or formed integrally with the window, to transform the light passing through the window.

FIG. 9E shows a schematic cross-section view of a twelfth example a method of fabricating a package having an integral window for packaging at least one microelectronic device according to the present invention, that is similar to the method shown in FIG. 3. The method further includes adding the capability to transform light that passes through window 26. In one example, this comprises attaching a lens 96 to a surface of window 26. In another example, this comprises forming window 26 having an integral lens 98 made by casting or molding. By using a convex lens, light passing through window 26 can be concentrated and focused on selected areas of chip or device 100. More than one lens 96 could be attached to window 26, with each lens having different optical properties. Conversely, a concave lens can be used to spread the light. Other combinations of lens, well-known in the art, can be used.

Alternatively, the method of FIG. 9E can comprise fabricating an array of binary optic lenslets made integral with the window 26. Binary optics technology is the application of semiconductor manufacturing methods to the fabrication of optics. A lens or lens array is laid out on a computer CAD program and transferred to a photo-mask using an e-beam or other writing process. A series of photo-masks are used, in conjunction with various etch steps, to build up the structures of interest. This fabrication technique can be used to make arrays of lenses with 1 micron features in completely arbitrary patterns. Lenslets arrays are straightforward to make with these methods, and can be extremely high quality with no dead space between elements. The advantage of binary optics is that the optical fabrication is not limited to spheres and simple surfaces. Lenslet arrays can be effectively used to performing optical remapping, such as transforming a round aperture into a square pupil. More details on the utility and methods for fabricating binary optic lenslet arrays can be found in U.S. Pat. No. 5,493,391 to Neal and Michie; as well as U.S. Pat. No. 5,864,381 by Neal and Mansell. Both of these referenced U.S. Patents are commonly assigned to the present assignee, i.e. Sandia Corporation of Albuquerque, N. Mex.

The method of the present invention can also comprise attaching an electrically-switched optical modulator to the package. Alternatively, electrically-switched optical modulator can replace window 26, such as a lithium niobate window. In the example of a lithium niobate window, application of voltages around 5–6 V can switch the material from being transparent to being opaque, at a frequency of a few billion times per second. Such a window can be used as a very fast shutter to control the amount of light being transmitted through window 26. More details about use of lithium niobate as a light modulation device can be found in U.S. Pat. No. 5,745,282 to Negi.

In the next section, we discuss examples of methods of packaging at least one microelectronic device in an package having an integral window.

Figure 10A:
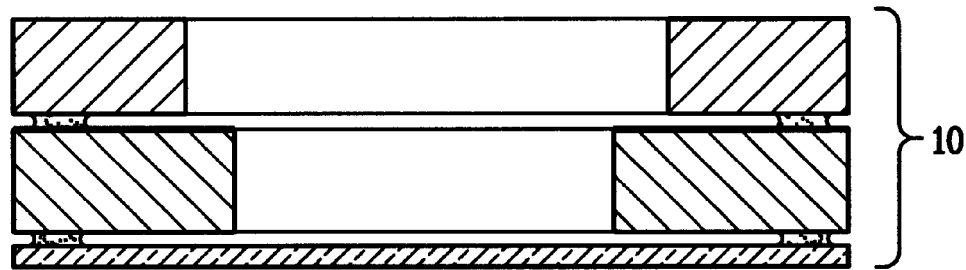
FIG. 10A shows a first step of a schematic cross-section view of a first example of a method of packaging a microelectronic device in a package having an integral window according to the present invention that is similar to the first example of FIG. 3.
Figure 10B:
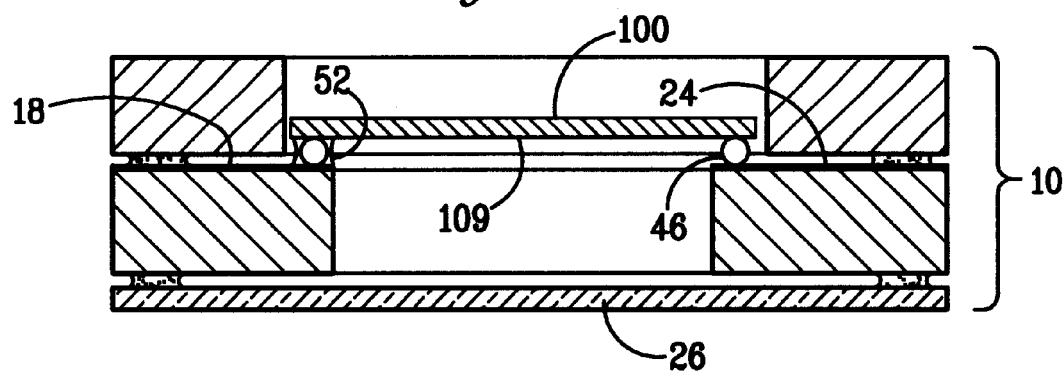
FIG. 10B shows a second step of a schematic cross-section view of a first example of a method of packaging a microelectronic device in a package having an integral window according to the present invention that is similar to the first example of FIG. 3.
Figure 10C:
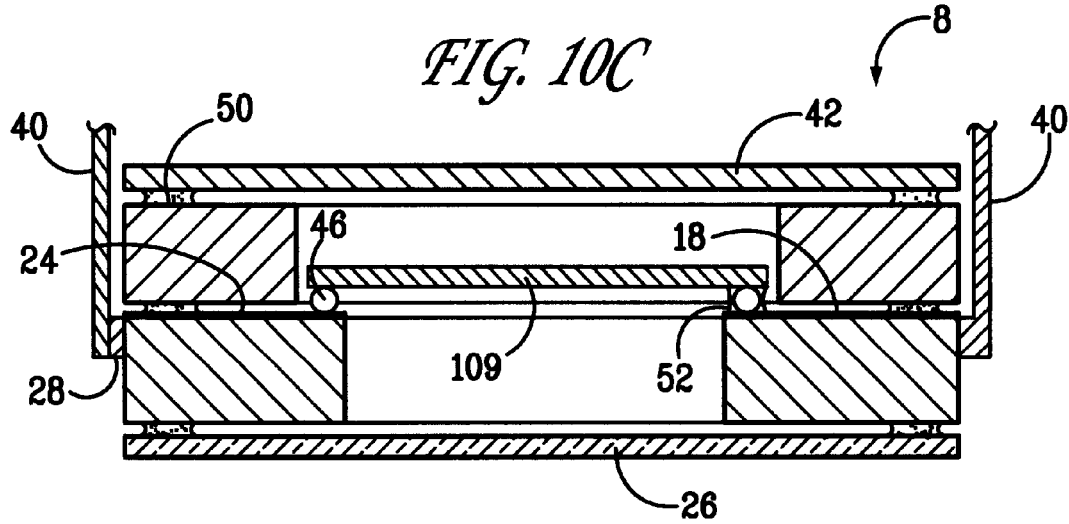

FIGS. 10A–10C show a first example of a method of packaging at least one microelectronic device in an package having an integral window, according to the present invention. In FIG. 10A, an package 10 is provided that is similar to the first example of FIG. 3. Then, in FIG. 10B, a microelectronic device, shown as a microelectronic device 100, is provided and mounted within package 10. Chip or device 100 can be attached to surface 18. Chip or device 100 can be flip-chip mounted via interconnect bump 46 to metallized trace 24. Chip or device 100 can comprise a light-sensitive chip or device (e.g. CCD chip, photocell, laser diode, MEMS device, or IMEMS device). The mounting of light-sensitive chip or device 100 can include orienting a light-sensitive side 109 facing towards window 26. An optional seal 52 can be made between chip or device 100 and surface 18, after flip-chip bonding has been performed. Seal 52 can have an annular shape. Seal 52 can provide protection from particulate contamination of the optically active face of chip or device 100 (e.g. active MEMS structures). In FIG. 10C, a cover lid 42 can be attached to surface 32 of plate 30, optionally including seal 50. This completes the process of packaging a microelectronic device in a package 8 having an integral window. Optionally, as shown in FIG. 10C, electrical leads 40 and bond pads 28 can be attached.

The method of flip-chip mounting, as shown in FIG. 10B, can comprise using a joining process selected from: brazing, reflow soldering, plasma-assisted dry soldering, thermocompression without vibration, thermocompression with vibration, and attachment with a conductive adhesive, such as silver-filled epoxy; as is well-known in the art.

Figure 11A:
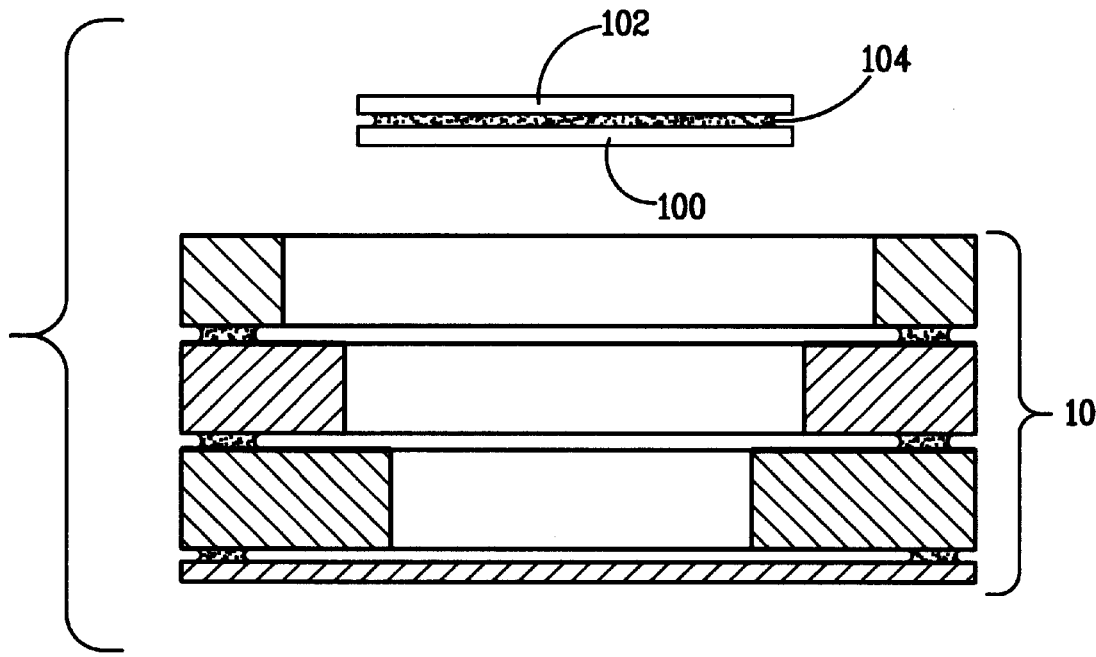
FIG. 11A shows a first step of a schematic cross-section view of a second example of a method of packaging a microelectronic device in a package having an integral window according to the present invention that is similar to the seventh example of FIG. 8.
Figure 11B:
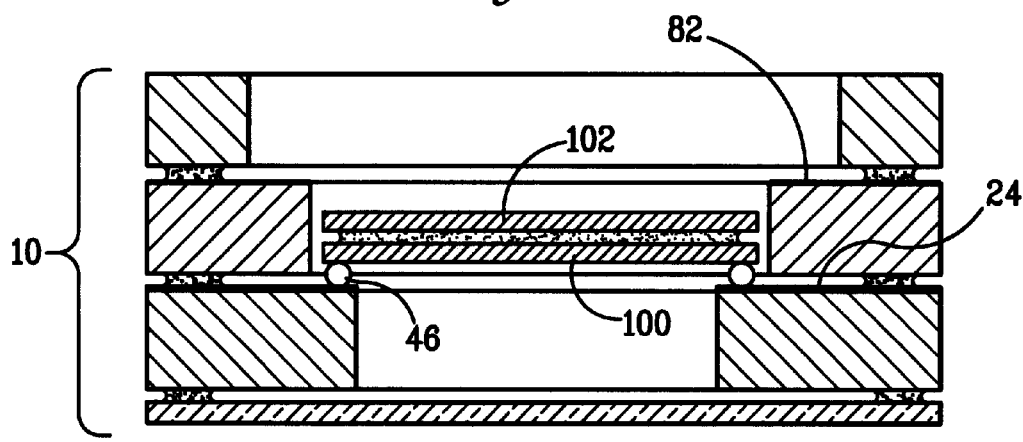
FIG. 11B shows a second step of a schematic cross-section view of a second example of a method of packaging a microelectronic device in a package having an integral window according to the present invention that is similar to the seventh example of FIG. 8.
Figure 11C:
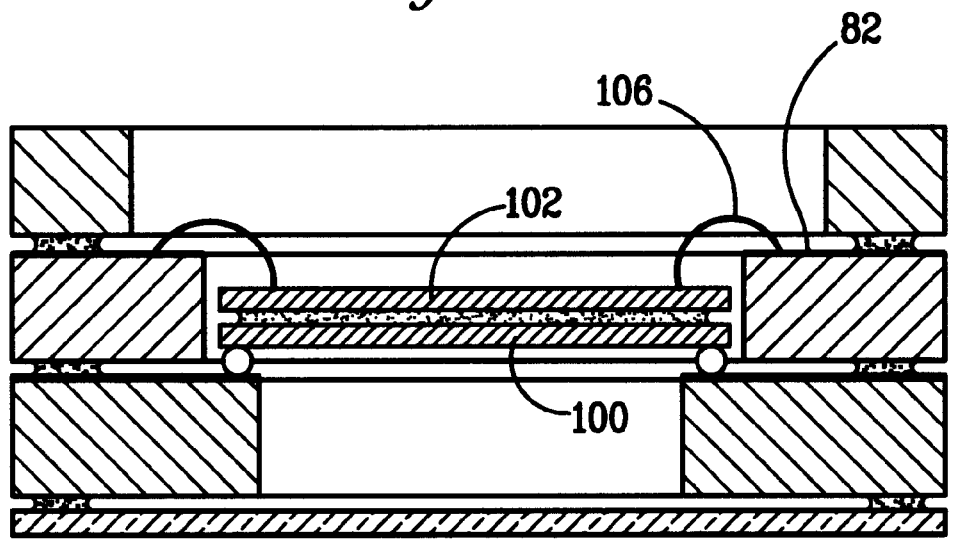
FIG. 11C shows a third step of a schematic cross-section view of a second example of a method of packaging a microelectronic device in a package having an integral window according to the present invention that is similar to the seventh example of FIG. 8.
Figure 11D:
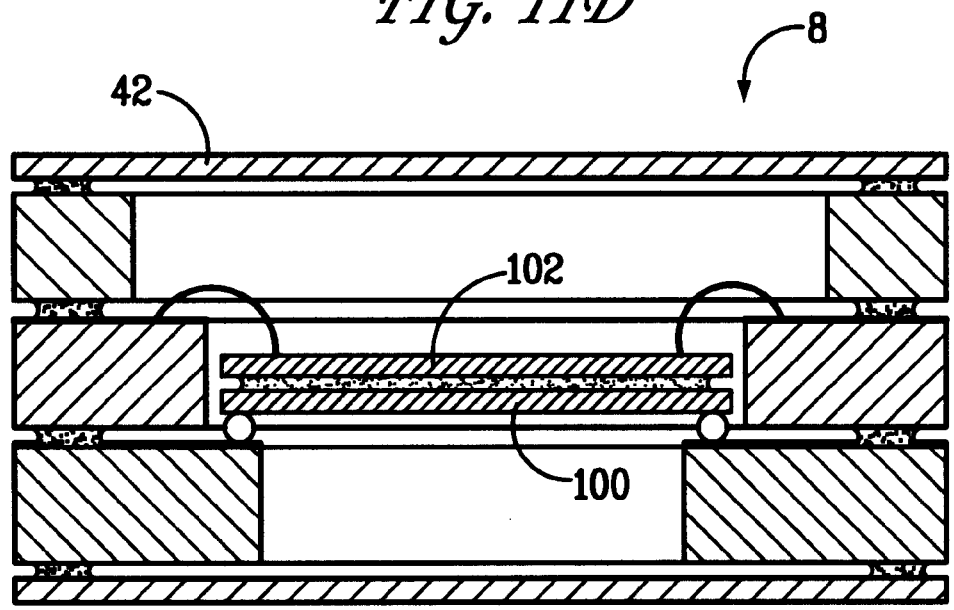
FIG. 11D shows a fourth step of a schematic cross-section view of a second example of a method of packaging a microelectronic device in a package having an integral window according to the present invention that is similar to the seventh example of FIG. 8.

FIGS. 11A–11D show a second example of a method of packaging at least one microelectronic device in an package having an integral window, according to the present invention. In FIG. 11A, an package 10 is provided that is similar to the second example of FIG. 5. The at least one microelectronic device can comprise a pair a microelectronic devices 100 and 102. Chips or devices 100 and 102 are provided and bonded together back-to-back at joint 104 using a joining process selected from silicon-to-silicon anodic bonding, eutectic bonding, soldering, and polymer-adhesive attachment. Eutectic bonding can comprise a gold-silicon eutectic braze. Next, in FIG. 11B, the back-to-back pair of chips or devices are mounted within package 10. Chip or device 100 can be attached to surface 18. Chip or device 100 can be flip-chip mounted via interconnect bump 46 to metallized trace 24. Next, in FIG. 11C, a wirebonded electrical lead 106 can be electrically attached to metallized trace 82 at one end and to chip or device 102 at the other end. Chip or device 102 can include a second light-sensitive side 110 mounted face-up, e.g. facing towards cover lid 42. Finally, in FIG. 11D, cover lid 42 can be attached to package 10 using a recessed lip similar to the recessed lip 58 shown in FIG. 7B. Cover lid 42 can be formed of a transparent material. Alternatively, cover lid 42 can also fabricated from a cofired ceramic multilayered material, including a cofired integral window.

This completes packaging of a pair of back-to-back chips or devices in a package having an integral window. This arrangement advantageously provides for optical access to a pair of optically-active microelectronic devices, through two different windows, in a single package. Alternatively, one chip or device can be a non-optically active device, such as a CMOS chip or device, and the other an optically-active device, such as a CCD chip or device. Those skilled in the art will understand that many other combinations are possible, and are included in this example.

Figure 12A:
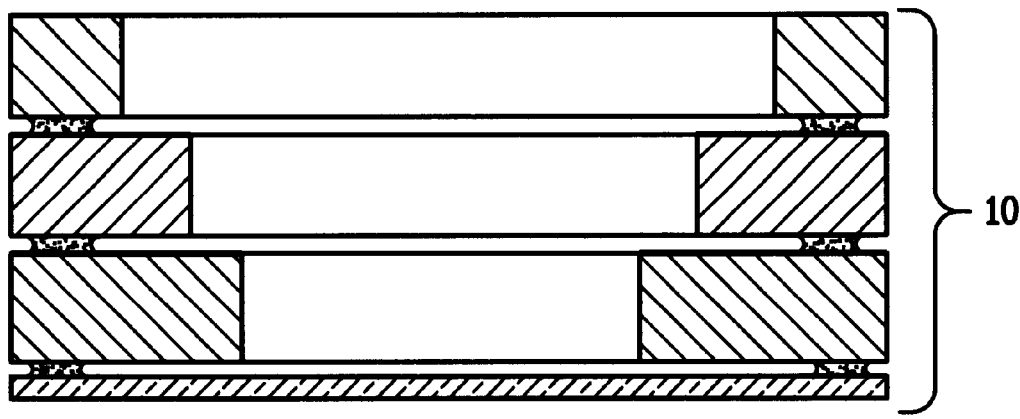
FIG. 12A shows a first step of a schematic cross-section view of a third example of a method of packaging a microelectronic device in a package having an integral window according to the present invention that is similar to the seventh example of FIG. 8.
Figure 12B:
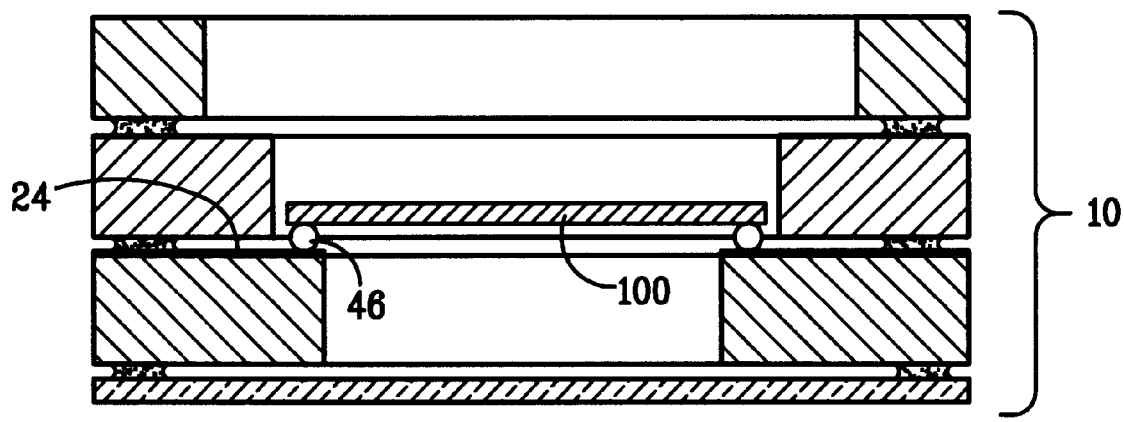
FIG. 12B shows a second step of a schematic cross-section view of a third example of a method of packaging a microelectronic device in a package having an integral window according to the present invention that is similar to the seventh example of FIG. 8.
Figure 12C:
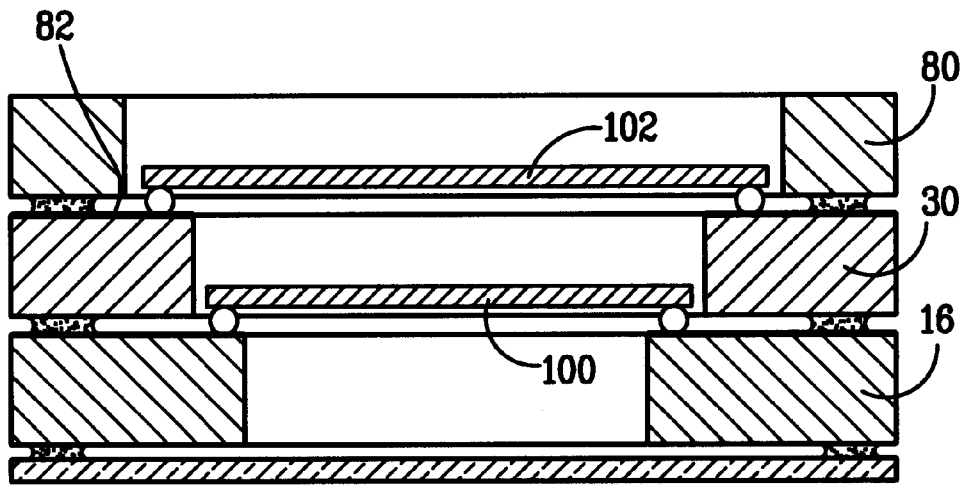
FIG. 12C shows a third step of a schematic cross-section view of a third example of a method of packaging a microelectronic device in a package having an integral window according to the present invention that is similar to the seventh example of FIG. 8.
Figure 12D:
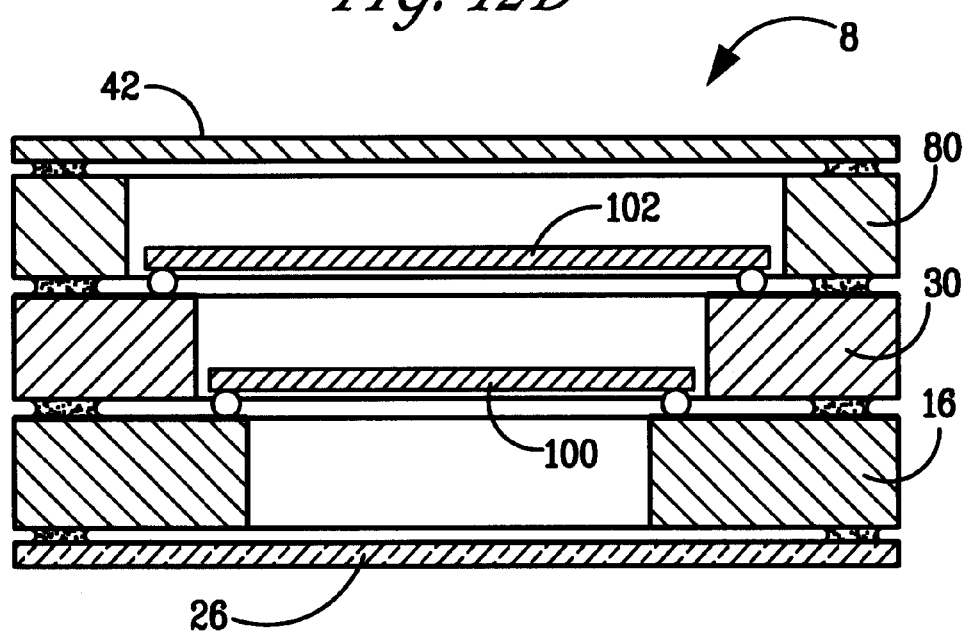
FIG. 12D shows a fourth step of a schematic cross-section view of a third example of a method of packaging a microelectronic device in a package having an integral window according to the present invention that is similar to the seventh example of FIG. 8.

FIGS. 12A–12D show a third example of a method of packaging at least one microelectronic device in an package having an integral window, according to the present invention. In FIG. 12A, package 10 is provided that is similar to the second example of FIG. 5. Next, in FIG. 12B, a first chip or device 100 is provided and can be flip-chip mounted via interconnect bump 46 to metallized trace 24. Next, in FIG. 12C, a second chip or device 102 is provided and can be flip-chip mounted to metallized trace 82. Finally, in FIG. 12D, cover lid 42 can be attached to package 10. This completes packaging of a pair of back-to-back chips or devices in a package 8 having an integral window. This arrangement advantageously provides for stacking of multiple devices inside of a single package having an integral window. The second chip or device can be a non-optically active device, such as a CMOS chip or device, and the first chip or device an optically-active device, such as a CCD chip or device. Those skilled in the art will understand that additional levels greater than the two levels shown in this example can be formed, each with metallized traces, so that additional chips or devices can be flip-chip mounted in a single package.

Those skilled in the art will appreciate that similar combinations of chips or devices and chip-mounting methods (e.g. flip-chip mounting and wirebonding), can be applied to each of the four examples of symmetric and double-stacked packages shown in FIGS. 9A–9D, for accomplishing the purpose of packaging multiple microelectronic devices within a single package having two opposing integral windows. Furthermore, by combining these arrangements with the use of conductive vias for passing electrical signals in-between the 4 different levels (e.g. FIGS. 9C and 9D), very complex optical-electrical-mechanical devices can be fabricated. Alternatively, multiple levels of exterior electrical leads 40 or bonding pads 28 can be connected on the exterior to provide communications between the four chips or devices. This arrangement provides the possibility of passing an optical signal through both apertures by direct transmission, or by conversion of optical signals to electrical, and back to optical via the optically-active chips or devices, including MEMS devices.

Figure 13:
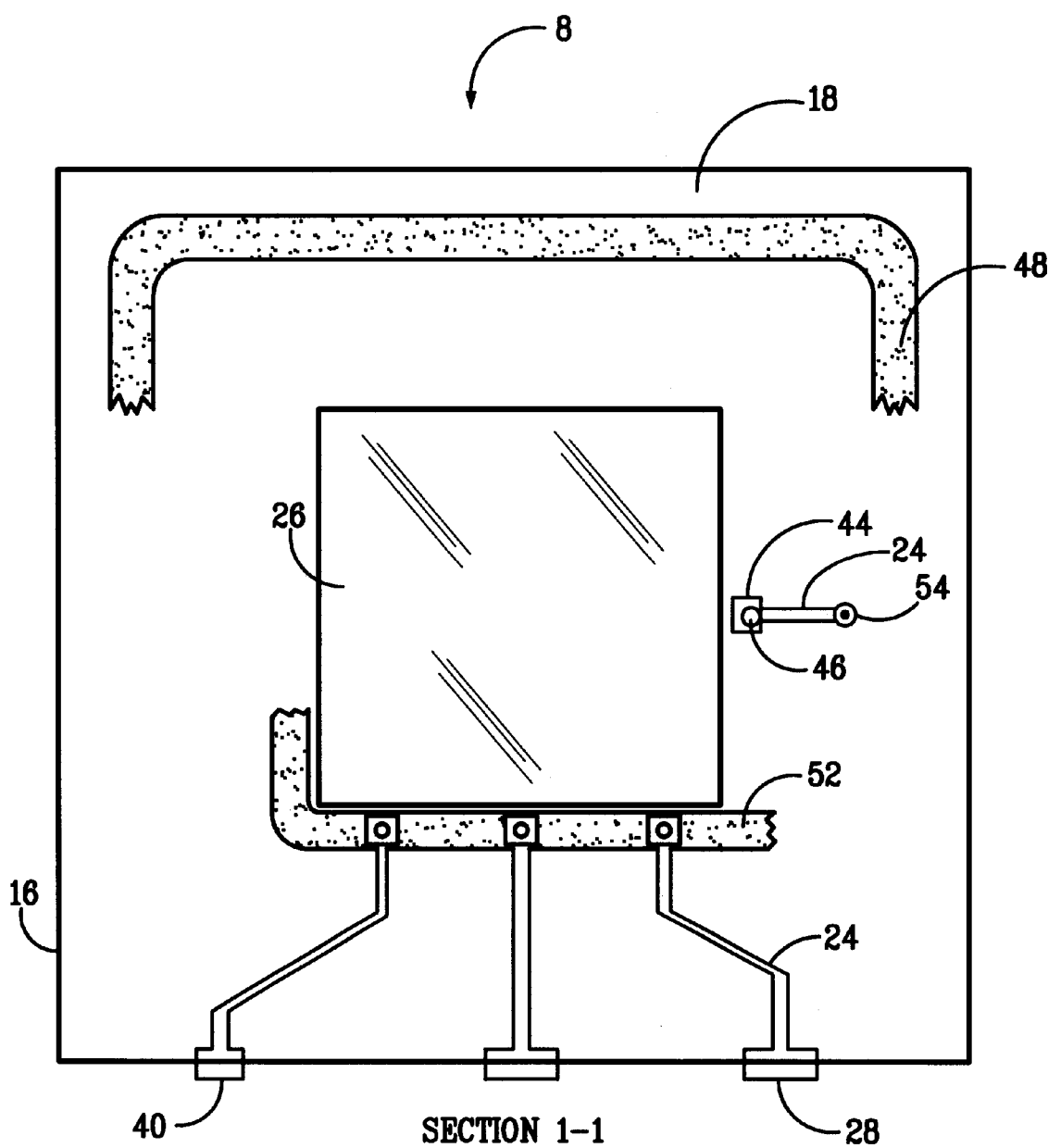
FIG. 13 shows a schematic top view along line 1—1 of FIG. 3 of a thirteenth example of a microelectronic package for packaging at least one microelectronic device according to the present invention, illustrating examples of the electrically conducting metallized traces located on the upper surface of the first plate, including interconnect bumps, interior bond pads, exterior bond pads, annular seal rings, and a conductive via.

FIG. 13 shows a schematic top view along line 1—1 of FIG. 3 of a thirteenth example of a method for fabricating a microelectronic package 8 for packaging at least one microelectronic device according to the present invention. The step of fabricating an electrically conductive metallized trace 24 on the second surface 18 of first plate 16 can comprise "fanning-out" the traces 24 from a fine pitch at the interior location to a coarser pitch a the exterior location. Trace 24 can be connected to either a bond pad 28 or an electrical lead 40. Trace 24 can also connect via 54 to interior bond pad 44. The deposition of seals 48 and 52 can include depositing them in the shape of an annular ring.

Figure 14:
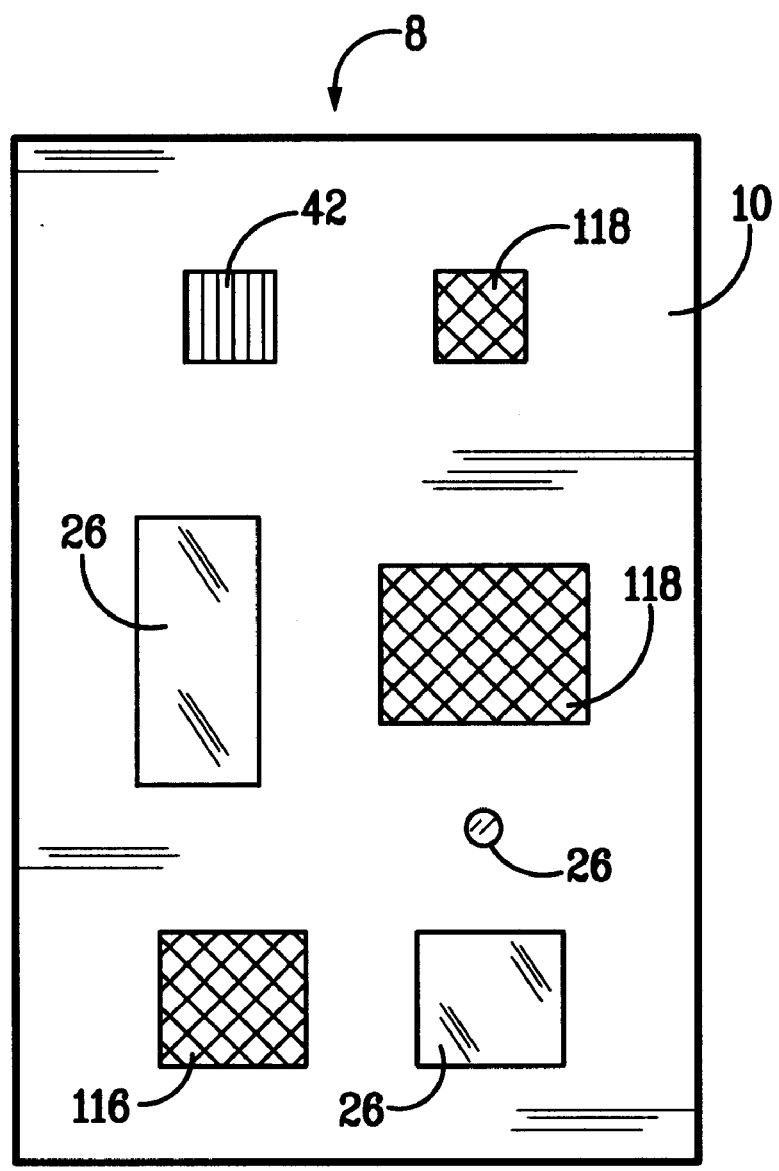
FIG. 14 shows a schematic top view of a fourteenth example of a microelectronic package for packaging at least one microelectronic device according to the present invention, wherein the package can be a multi-chip module (MCM), including multiple integral windows and multiple microelectronic devices in a two-dimensional array.

FIG. 14 shows a schematic top view of a fourteenth example of a method for fabricating a microelectronic package 8 for packaging at least one microelectronic device according to the present invention, wherein package 8 can be a multi-chip module (MCM) having a two-dimension array of microelectronic devices. In this example, the fabrication of package 8 includes forming more than one (e.g. three) compartment, each having an integral window 26. These windows can be LTCC or HTCC cofired simultaneously along with the rest of the package. Additional microelectronic devices 116 and microelectronic components 118 (e.g. capacitors, resistors, IC's) can be surface mounted to package 8 by conventional techniques, including flip-chip bonding and wirebonding. Cofired windows 26 and/or cover lids 42 can be placed on either side, or both, of the MCM package 8. Multiple light-sensitive chips or devices can be mounted inside of the multiple windowed compartments.

FIGS. 15A–D shows a schematic top view of a fourth example of a method for packaging at least one microelectronic device inside a microelectronic package according to the present invention, comprising a package 10 of electrically insulating plates, wherein window 26 is attached to package 10 after chip or device 100 has been flip-chip mounted. Package 10 comprises a first plate 16, having a first surface 20, an opposing second surface 18, and a first aperture 22 through plate 16. Plate 16 also has an electrically conductive metallized trace 24 disposed on surface 18. Package 10 further comprises a second plate 30, which has a third surface 34, an opposing fourth surface 32, and a second aperture 36 through plate 30 for providing access to insert a microelectronic device 100 into package 10. Plate 16 is attached to second plate 30 by joining surface 18 to surface 34, whereby package 10 is formed. At least one lateral dimension of aperture 36 is larger than the corresponding lateral dimension of aperture 22. Aperture 22 can be substantially aligned with aperture 36. The lateral dimensions of aperture 36 are larger than the lateral dimensions of microelectronic device 100, so that a device 100 can be inserted easily inside of apertures 36 and 22. Microelectronic device 100 can comprise a microelectronic device 100.

Figure 15A:
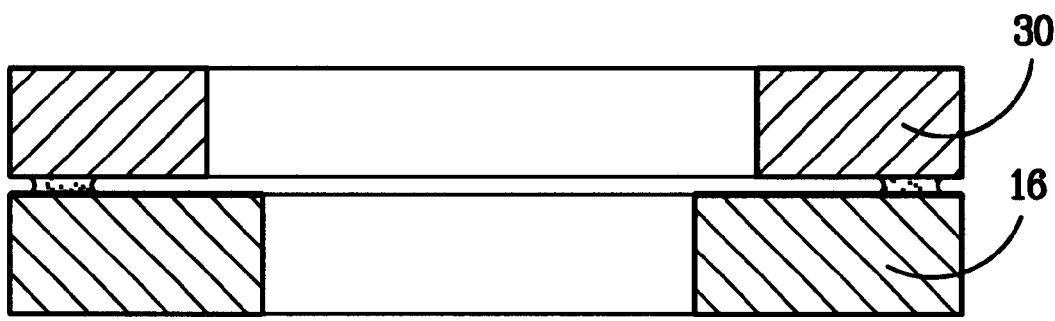
FIG. 15A shows a first step of a schematic cross-section view of a fourth example of a method of packaging a microelectronic device in a package having an integral window according to the present invention that is similar to the first example of FIG. 3.
Figure 15B:
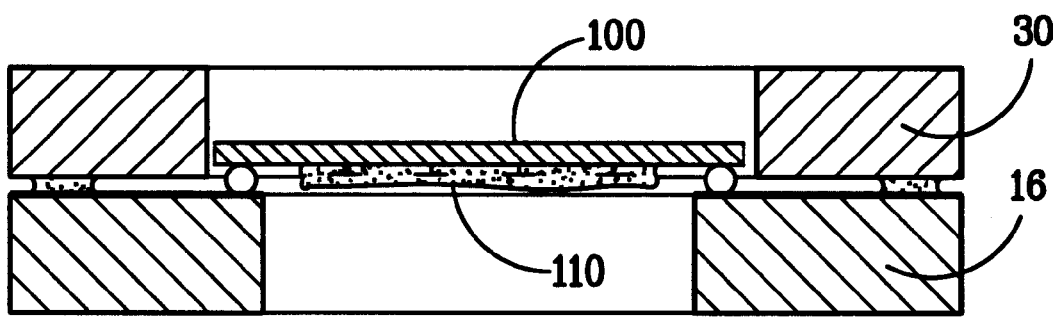
FIG. 15B shows a second step of a schematic cross-section view of a fourth example of a method of packaging a microelectronic device in a package having an integral window according to the present invention that is similar to the first example of FIG. 3.
Figure 15C:
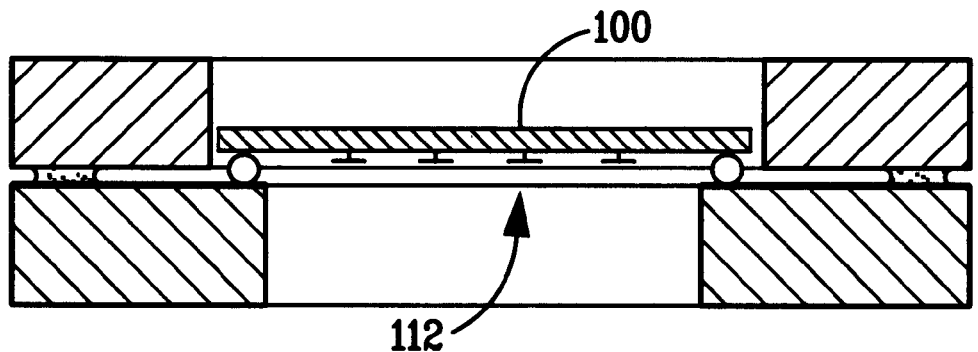
FIG. 15C shows a second step of a schematic cross-section view of a fourth example of a method of packaging a microelectronic device in a package having an integral window according to the present invention that is similar to the first example of FIG. 3.

In FIG. 15B, a microelectronic device 100 is provided that includes unreleased MEMS structures. These structures have a sacrificial coating 110 to protect the fragile MEMS structures. Chip or device 100 with unreleased MEMS structure can be flip-chip mounted to trace 24 on plate 16. Next, in FIG. 15C, the MEMS elements are released by etching away the protective coating. The etching process 112 can include wet or dry etching methods. Wet etching can include a using selective wet etchant (e.g. comprising hydrofluoric acid or hydrochloric acid) that etches away a sacrificial material (e.g. silicon dioxide or a silicate glass) surrounding and separating elements of the MEMS structure without substantially attacking other materials (e.g. polycrystalline silicon and silicon nitride) used to form the elements of the MEMS structure. Alternatively, dry plasma etching can be used, which exposes the MEMS elements to a reactive ion plasma discharge (e.g. oxygen ion). Dry plasma etching is effective at removing vacuum-deposited conformal coatings (e.g. parylene coatings).

Figure 15D:
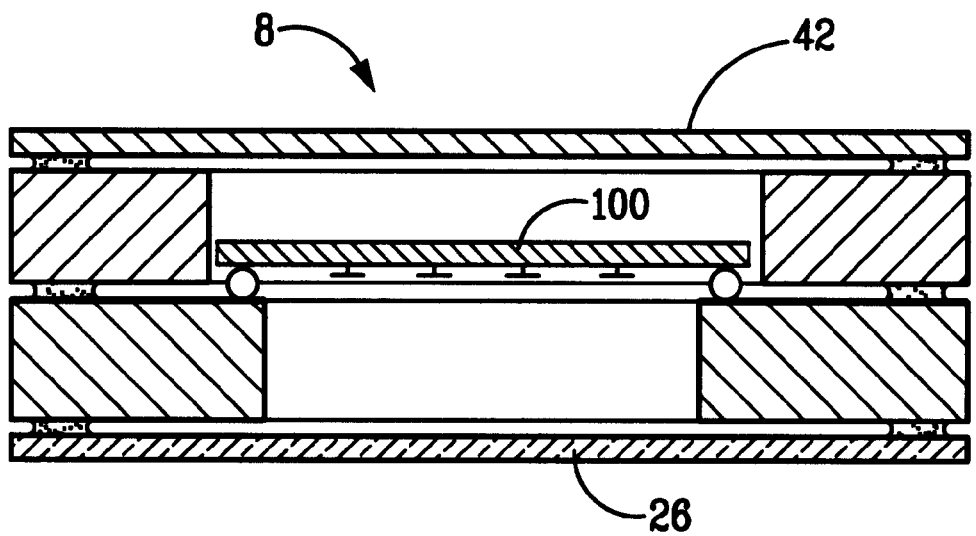
FIG. 15D shows a second step of a schematic cross-section view of a fourth example of a method of packaging a microelectronic device in a package having an integral window according to the present invention that is similar to the first example of FIG. 3.

Finally, in FIG. 15D, after the MEMS elements have been successfully etched and released, then window 26 and cover lid 42 can be attached, thereby completing packaging of MEMS device in a windowed package. An alternative sequence can be to attach cover lid 42 after flip-chip mounting, but before performing the release step.

The primary advantage of releasing the MEMS elements after flip-chip mounting is to protect the fragile MEMS elements from damage and contamination as long as possible during the entire process of packaging. The example of the present invention shown in FIG. 15A–D accomplishes this goal by reducing to one step (e.g. attaching the window) the number of processing steps required after the MEMS elements have been released.

The particular examples discussed above are cited to illustrate particular embodiments of the invention. Other applications and embodiments of the apparatus and method of the present invention will become evident to those skilled in the art. For example, the electrically insulating plates with apertures can be replaced with open frames. The actual scope of the invention is defined by the claims appended hereto.

We claim:

1. A method of fabricating a microelectronic package having an integral window, comprising:

forming a first electrically insulating plate having a first surface, an opposing second surface, and a first aperture disposed through said first plate;

fabricating an electrically conductive metallized trace on said second surface of said first plate;

attaching a window to said first plate;

forming a second electrically insulating plate having a third surface, an opposing fourth surface, and a second aperture disposed through said second plate; wherein said second aperture is larger than said first aperture; and attaching said first plate to said second plate by joining said second surface to said third surface; and further comprising applying a surface treatment to a mating surface to improve wettability and adhesion to said corresponding mating surface.

2. A method of fabricating a microelectronic package having an integral window, comprising:

forming a first electrically insulating plate having a first surface, an opposing second surface, and a first aperture disposed through said first plate;

fabricating an electrically conductive metallized trace on said second surface of said first plate;

attaching a window to said first plate;

forming a second electrically insulating plate having a third surface, an opposing fourth surface, and a second aperture disposed through said second plate; wherein said second aperture is larger than said first aperture; and attaching said first plate to said second plate by joining said second surface to said third surface; and further comprising applying an anti-reflection coating to said window.

3. A method of fabricating a microelectronic package having an integral window, comprising:

forming a first electrically insulating plate having a first surface, an opposing second surface, and a first aperture disposed through said first plate;

fabricating an electrically conductive metallized trace on said second surface of said first plate;

attaching a window to said first plate;

forming a second electrically insulating plate having a third surface, an opposing fourth surface, and a second aperture disposed through said second plate; wherein said second aperture is larger than said first aperture; and attaching said first plate to said second plate by joining said second surface to said third surface;

wherein forming said package comprises laminating a plurality of electrically insulating sheets; and wherein said laminating step comprises:
personalizing said sheets;
stacking and registering said personalized sheets to form a stack of personalized sheets;
holding said stack of personalized sheets as a rigid assembly; and
baking and firing said rigid assembly, whereby said stacked sheets are cofired and laminated together to form a unitized, monolithic package.

4. The method of claim 3, wherein said personalizing step comprises cutting out an individual sheet, having an outside perimeter and an interior aperture, from a larger piece of electrically insulating material.

5. The method of claim 4, wherein said personalizing step further comprises machining a hole for an electrically conductive via.

6. The method of claim 4, wherein said personalizing step further comprises depositing a conductive paste or ink on a surface of said individual sheet.

7. The method of claim 3, further comprising inserting said window into an opening within said stack of personalized sheets, concurrently while stacking and registering said personalized sheets.

8. The method of claim 3, wherein said rigid assembly is fired at a high temperature in the range of 1300 C. to 1800 C.

9. The method of claim 3, wherein said rigid assembly is fired at a low temperature in the range of 600 C. to 1300 C.

10. The method of claim 3, further comprising attaching a cover lid to said package, thereby forming a sealed package.

11. The method of claim 10, wherein attaching said cover lid further comprises using a process selected from the group consisting of brazing, hermetically sealing with frit glass, reflow soldering, plasma-assisted dry soldering, and adhesively attaching.

12. The method of claim 10, further comprising attaching a second window to said cover lid before attaching said cover lid to said package.

13. The method of claim 10, further comprising attaching a second window to said cover lid after attaching said cover lid to said package.

14. The method of claim 3, further comprising:
fabricating a second electrically conductive metallized trace disposed on said fourth surface of said second plate;
forming a third plate, having a third aperture disposed through said third plate, wherein said third aperture is larger than said second aperture; and
attaching said third plate to said fourth surface of said second plate.

15. The method of claim 14, wherein said third aperture is substantially aligned with said second aperture.

16. The method of claim 3, wherein said second aperture is substantially aligned with said first aperture.

17. The method of claim 3, further comprising:
providing a microelectronic device;
mounting said microelectronic device within said package; and
attaching a cover lid to said package, whereby said device is housed inside of a package having an integral window.

18. The method of claim 12, wherein said microelectronic device comprises a light-sensitive side.

19. The method of claim 18, further comprising orienting said light-sensitive side facing said window.

20. The method of claim 17, further comprising flip-chip mounting said microelectronic device to said electrically conductive metallized trace disposed on said second surface.

21. The method of claim 20, wherein flip-chip mounting further comprises using a process selected from the group consisting of brazing, reflow soldering, plasma-assisted dry soldering, thermocompression without vibration, thermocompression with vibration, and attachment with a conductive adhesive.

22. The method of claim 17, wherein said microelectronic device comprises a CCD chip.

23. The method of claim 17, wherein said microelectronic device comprises a MEMS or IMEMS device.

24. The method of claim 17, further comprising applying a seal in-between said microelectronic device and said second surface.

25. A method of fabricating a microelectronic package having an integral window, comprising:

forming a first electrically insulating plate having a first surface, an opposing second surface, and a first aperture disposed through said first plate;

fabricating an electrically conductive metallized trace on said second surface of said first plate;

attaching a window to said first plate;

forming a second electrically insulating plate having a third surface, an opposing fourth surface, and a second aperture disposed through said second plate; wherein said second aperture is larger than said first aperture; and attaching said first plate to said second plate by joining said second surface to said third surface; and further comprising attaching a cover lid to said package, thereby forming a sealed package; and further comprising substantially removing ambient air from inside said package; and then replacing it with at least one gas other than air, before attaching said cover lid to said package.

26. A method of fabricating a microelectronic package having an integral window, comprising:
   forming a first electrically insulating plate having a first surface, an opposing second surface, and a first aperture disposed through said first plate;
   fabricating an electrically conductive metallized trace on said second surface of said first plate;
   attaching a window to said first plate;
   forming a second electrically insulating plate having a third surface, an opposing fourth surface, and a second aperture disposed through said second plate; wherein said second aperture is larger than said first aperture;
   attaching said first plate to said second plate by joining said second surface to said third surface; and
   further comprising fabricating said window with an integral lens.

27. The method of claim 26, wherein fabricating said window with an integral lens comprises fabricating an array of binary optic lenslets integral with said window.

28. The method of claim 26, wherein fabricating said window with an integral lens comprises casting or molding said window with said integral lens.

29. A method of fabricating a microelectronic package having an integral window, comprising:
   forming a first electrically insulating plate having a first surface, an opposing second surface, and a first aperture disposed through said first plate;
   fabricating an electrically conductive metallized trace on said second surface of said first plate;
   attaching a window to said first plate;
   forming a second electrically insulating plate having a third surface, an opposing fourth surface, and a second aperture disposed through said second plate; wherein said second aperture is larger than said first aperture;
   attaching said first plate to said second plate by joining said second surface to said third surface; and
   further comprising attaching a lens to said window.

30. A method of fabricating a microelectronic package having an integral window, comprising:
   forming a first electrically insulating plate having a first surface, an opposing second surface, and a first aperture disposed through said first plate;
   fabricating an electrically conductive metallized trace on said second surface of said first plate;
   attaching a window to said first plate;
   forming a second electrically insulating plate having a third surface, an opposing fourth surface, and a second aperture disposed through said second plate; wherein said second aperture is larger than said first aperture;
   attaching said first plate to said second plate by joining said second surface to said third surface; and
   further comprising attaching an electrically-switched optical modulator to said package, for modulating light passing through an aperture.

31. The method of claim 30, wherein said electrically-switched optical modulator comprises a lithium niobate window.

32. A method for packaging at least one microelectronic device in a package having an integral window, comprising:
   providing a package comprising:
      a first electrically insulating plate having a first surface, an opposing second surface, and a first aperture disposed through said first plate;
      a first electrically conductive metallized trace on said second surface of said first plate;
      an integral window attached to said first plate;
      a second electrically insulating plate having a third surface, an opposing fourth surface, and a second aperture disposed through said second plate;
      wherein said second aperture is larger than said first aperture; and
      wherein said second surface of said first plate is attached to said third surface of said second plate; and further comprising:
         a second electrically conductive metallized trace disposed on said fourth surface of said second plate;
         a third electrically insulating plate, having a third aperture disposed through said third plate, wherein said third aperture is larger than said second aperture; and
         wherein said third plate is attached to said fourth surface of said second plate;
   providing a first microelectronic device;
   flip-chip mounting said first microelectronic device to said first electrically conductive metallized trace disposed on said second surface;
   providing a second microelectronic device;
   mounting and electrically interconnecting said second microelectronic device to said second electrically conductive metallized trace disposed on said fourth surface; and
   attaching a cover lid to said package.

33. The method of claim 32, wherein electrically interconnecting said second microelectronic device comprises flip-chip mounting said second microelectronic device to said second electrically conductive metallized trace disposed on said fourth surface, before attaching said cover lid to said package.

34. The method of claim 32, further comprising:
   bonding together back-to-back said first microelectronic device and said second microelectronic device; and then
   wirebonding said second microelectronic device to said second electrically conductive metallized trace disposed on said fourth surface, before attaching said cover lid to said package.

35. The method of claim 34, wherein said second microelectronic device comprises a light-sensitive side facing towards said cover lid; and further wherein said cover lid comprises a transparent material.

36. The method of claim 34, wherein bonding together back-to-back said first microelectronic device and said second microelectronic device comprises using a process selected from the group consisting of anodic bonding, eutectic bonding, soldering, and adhesive attachment.

37. A method of fabricating a microelectronic package having an integral window, comprising:
   a) laminating together a plurality of individual layers of an electrically insulating material to form a first electrically insulating plate comprising a multilayered material, a first surface, an opposing second surface, and a first aperture disposed through said first plate;
   b) fabricating a first electrically conductive metallized trace on said second surface of said first plate;
   c) joining a window, disposed across said first aperture, to said first plate;
   d) providing a second electrically insulating plate having a third surface, an opposing fourth surface, and a second aperture disposed through said second plate; wherein said second aperture is larger than said first aperture; and e) joining the second surface of said first plate to said third surface of said second plate.

38. The method of claim 37, wherein joining said window comprises using a joining process selected from the group consisting of casting, brazing, frit glass sealing, reflow soldering, plasma-assisted dry soldering, and attaching with adhesives.

39. The method of claim 37, further comprising attaching an electrical lead to said first metallized trace at an exterior location.

40. The method of claim 37, wherein fabricating said first electrically conductive metallized trace comprises using a screen-printed thick-film metallization process or an etched foil process.

41. The method of claim 37, wherein attaching said first plate to said second plate comprises using a process selected from the group consisting of brazing, frit glass sealing, reflow soldering, plasma-assisted dry soldering, and attaching with adhesives.

42. The method of claim 37, wherein said first electrically conductive metallized trace if fabricated after attaching said window to said first plate.

43. The method of claim 37, wherein joining said window to said first plate comprises using frit glass sealing.

44. The method of claim 37, wherein said multilayered material is selected from the group consisting of a printed wiring board composition, a low-temperature cofired ceramic composition, and a high-temperature cofired ceramic composition.

45. The method of claim 37, wherein said window is disposed inside of said first aperture.

46. The method of claim 45, wherein said window is joined to a lip recessed inside of said first plate.

47. The method of claim 37, wherein joining said window to said first plate occurs simultaneously during step a) while laminating together said plurality of individual layers of electrically insulating material.

48. The method of claim 47, wherein the geometrical relationship between said window and said first plate comprises an encased joint geometry.

49. The method of claim 48, said window is joined to said first plate without using a separate sealing material disposed in-between said window and said plate.

50. The method of; claim 37, wherein said window substantially fills said first aperture.

51. The method of claim 50, wherein joining said window to said first plate comprises casting a castable window material directly into said first aperture; wherein the castable window material is selected from the group consisting of a molten glass that solidifies after casting and a liquid polymer that hardens after casting.

52. The method of claim 37, wherein said window is a material selected from the group consisting of borosilicate glass, quartz glass, fused silica, optical quality glass, a transparent ceramic, sapphire, an optically transparent polymer, an UV transparent polymer, PMMA, an IR transparent material, silicon, a metal, a metal alloy, a material that switches from being optically transparent to being opaque at voltages around 5–6 volts, and lithium niobate.

53. The method of claim 37, further comprising flip-chip mounting a first microelectronic device to said first electrically conductive metallized trace after said window has been joined to said first plate.

54. The method of claim 37, further comprising:
f) providing an unreleased MEMS device;
g) mounting said MEMS device to said third surface of said second plate;
h) electrically interconnecting said MEMS device to said first electrically conductive metallized trace; and
i) releasing said MEMS device after mounting said MEMS device in step h).

55. The method of claim 54, wherein joining said window in step c) is performed after releasing said MEMS device in step i).

56. The method of claim 54, further comprising:
j) attaching a cover lid to said fourth surface of said second plate.

57. The method of claim 56, wherein attaching said cover lid in step j) is performed after releasing said MEMS device in step i).

58. The method of claim 56, wherein attaching said cover lid in step j) is performed before mounting said MEMS device in step g).

59. The method of claim 54, wherein said unreleased MEMS device comprises MEMS structures having a sacrificial protective coating disposed said MEMS structures.

60. The method of claim 59, wherein said sacrificial protective coating comprises a vacuum-deposited conformal coating.

61. The method of claim 60, wherein releasing said MEMS device in step i) comprises using a dry plasma etching process to remove said vacuum-deposited conformal coating.

62. The method of claim 59, wherein said vacuum-deposited conformal coating comprises parylene.

63. A method of fabricating a package with an integral window for housing a microelectronic device, comprising:
a) personalizing a first set of individual layers of an electrically insulating multilayer material by removing a cutout shape from each layer; wherein removal of said cutout shape from each layer of said first set of individual layers defines a first aperture; and wherein said first set of individual layers comprises a top layer;
b) personalizing a second set of individual layers of an electrically insulating multilayer material by removing a cutout shape from each layer; wherein removal of said cutout shape from each layer of said second set of individual layers defines a second aperture; and further wherein said second aperture is wider than said first aperture;
c) depositing a first electrical conductor on said top layer of said first set of individual layers;
d) stacking and registering said second set of individually personalized layers on top of said first set of individually personalized layers, including placing a window at a specified location in said first set; thereby making an assembled stack of said first and second sets including said window; wherein said window is disposed across said first aperture; and
e) processing said assembled stack of said first and second sets including said window by applying sufficient pressure and temperature to said assembled stack for sufficient time to form a consolidated monolithic multi-layered body having an integral window; wherein said window is bonded directly to said consolidated monolithic multilayered body without having a separate layer of sealing material disposed in-between said window and said body.

64. The method of claim 63, further comprising:
f) providing an unreleased MEMS device;
g) mounting said MEMS device to said top layer of said first set of individual layers;
h) electrically interconnecting said MEMS device to said first electrical conductor; and
i) releasing said MEMS device after mounting said MEMS device in step g).

* * * * *